(12) United States Patent
Sugita et al.

(10) Patent No.: US 7,888,859 B2
(45) Date of Patent: Feb. 15, 2011

(54) ORGANIC ELECTROLUMINESCENCE ELEMENT, DISPLAY DEVICE AND LIGHTING DEVICE

(75) Inventors: Shuichi Sugita, Tokyo (JP); Hiroshi Kita, Tokyo (JP); Hideo Taka, Tokyo (JP)

(73) Assignee: Konica Minolta Holdings Inc. (JP)

( * ) Notice: Subject to any disclaimer, the term of this patent is extended or adjusted under 35 U.S.C. 154(b) by 295 days.

(21) Appl. No.: 11/817,271

(22) PCT Filed: Feb. 10, 2006

(86) PCT No.: PCT/JP2006/302327

§ 371 (c)(1),
(2), (4) Date: Aug. 28, 2007

(87) PCT Pub. No.: WO2006/092943

PCT Pub. Date: Sep. 8, 2006

(65) Prior Publication Data

US 2009/0021147 A1    Jan. 22, 2009

(30) Foreign Application Priority Data

Mar. 2, 2005    (JP) .............................. 2005-057051

(51) Int. Cl.
*H05B 33/00* (2006.01)
(52) U.S. Cl. .................. 313/504; 313/506; 428/917
(58) Field of Classification Search ............... None
See application file for complete search history.

(56) References Cited

U.S. PATENT DOCUMENTS

| 6,800,722 | B2 * | 10/2004 | Pei | ............................. 528/423 |
| 7,304,428 | B2 * | 12/2007 | Ghosh et al. | .................. 313/506 |
| 7,338,722 | B2 * | 3/2008 | Thompson et al. | ........... 428/690 |
| 2003/0207152 | A1 * | 11/2003 | Hsieh et al. | ................... 428/690 |
| 2004/0247934 | A1 * | 12/2004 | Takeuchi et al. | .............. 428/690 |
| 2005/0194896 | A1 * | 9/2005 | Sugita et al. | ................. 313/506 |
| 2005/0202279 | A1 * | 9/2005 | Zheng et al. | .................. 428/690 |
| 2008/0114151 | A1 * | 5/2008 | Shirasawa et al. | ............ 528/395 |

FOREIGN PATENT DOCUMENTS

| JP | 5-247547 | 9/1993 |
| JP | 2001-312223 | 11/2001 |
| JP | 2002-275249 | 9/2002 |
| JP | 2003-73666 | 3/2003 |
| JP | 2003-86377 | 3/2003 |
| JP | 2004-103401 | 4/2004 |
| JP | 2005-44790 | 2/2005 |
| JP | 2005-44791 | 2/2005 |

OTHER PUBLICATIONS

Bof Bufon et al., "Relationship between Chain Length, Disorder, and Resistivity in Polypyrrole Films," 2005, J. Phys. Chem. B, 109, pp. 19191-19199.*
International Search Report for International Application No. PCT/JP2006/302327 mailed Apr. 25, 2006.

* cited by examiner

*Primary Examiner*—Ashok Patel
(74) *Attorney, Agent, or Firm*—Cantor Colburn LLP

(57) ABSTRACT

In an organic electroluminescence element which incorporates a substrate having thereon an anode and a cathode and which incorporates a plurality of organic layers between the aforesaid anode and cathode, wherein at least one of the aforesaid organic layers is a first organic layer incorporating a compound having at most 10 repeating units, the first organic layer being prepared by coating the compound having at least one polymerizable group, followed by polymerization.

7 Claims, 4 Drawing Sheets

FIG. 2
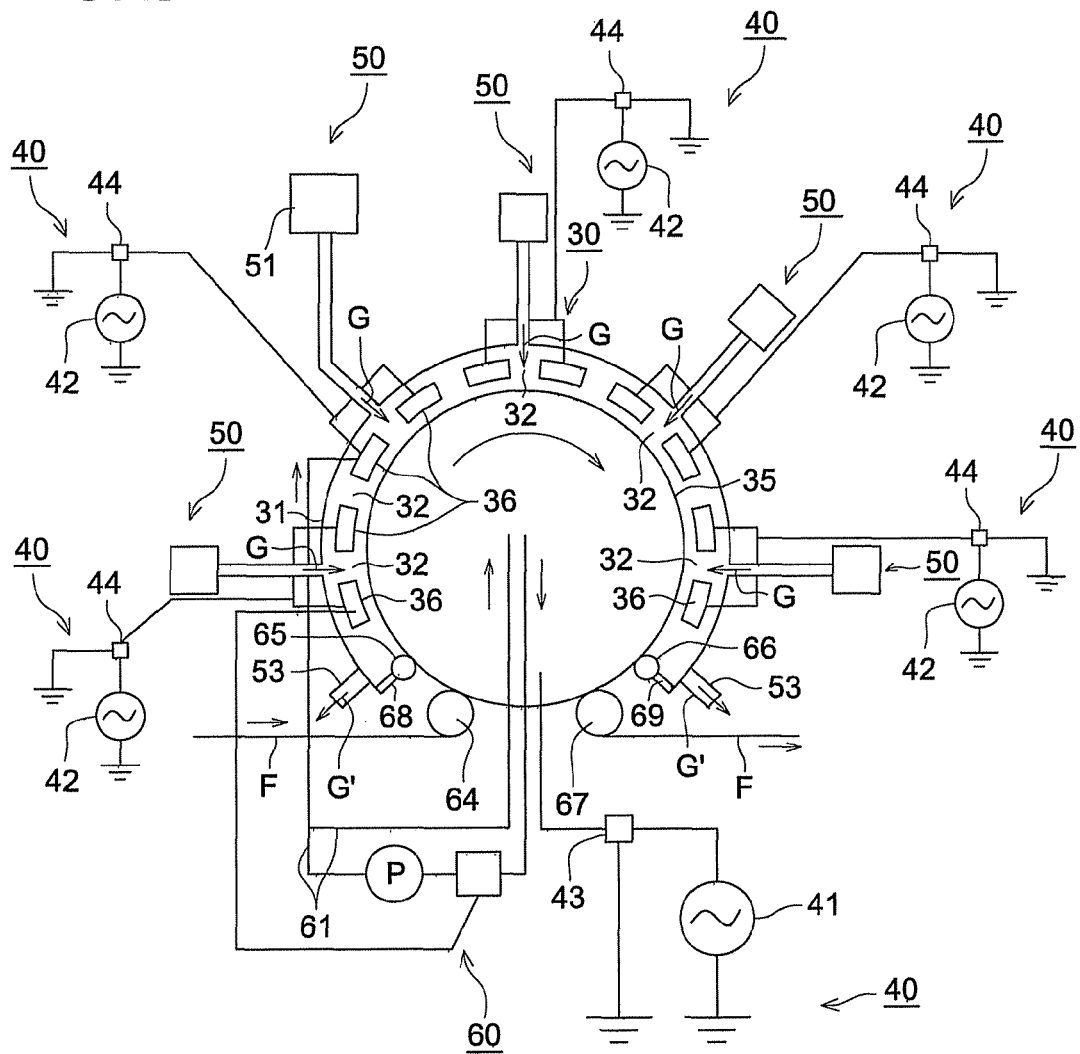
FIG. 3
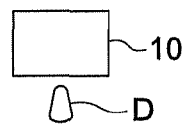
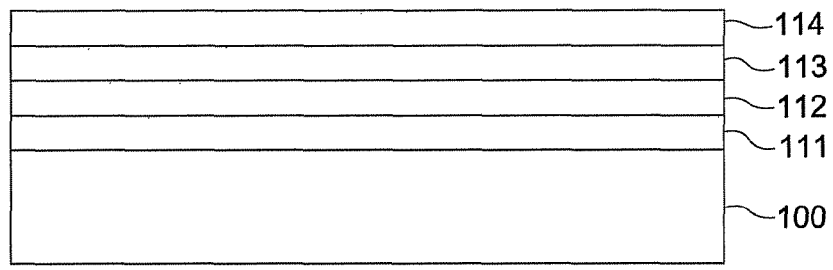

LIGHT

LIGHT

ORGANIC ELECTROLUMINESCENCE ELEMENT, DISPLAY DEVICE AND LIGHTING DEVICE

CROSS REFERENCE TO RELATED APPLICATIONS

This is a U.S. national stage of application No. PCT/JP2006/302327, filed on 10 Feb. 2006. Priority under 35 U.S.C. §119(a) and 35 U.S.C. §365(b) is claimed from Japanese Application No. 2005-057051, filed 2 Mar. 2005, the disclosure of which is also incorporated herein by reference.

TECHNICAL FIELD

The present invention relates to an organic electroluminescence element, a display device employing the same, and a lighting device.

BACKGROUND

Heretofore, cited as a light emitting type electronic display device has been an electroluminescence display (ELD). Constituting elements of ELD include an inorganic electroluminescence element and an organic electroluminescence element (hereinafter also referred to as an organic EL element).

The organic EL element is constituted in such a manner that a light emitting layer, which incorporates light emitting compounds, is sandwiched between a cathode and an anode. In the above element, electrons and positive holes are injected into the light emitting layer and are subjected to recombination, whereby exciton is generated. During deactivation of the resulting exciton, light (fluorescence and phosphorescence) is emitted. Light emission can be realized via application of a voltage of several V—several tens V. Further, the organic EL element exhibits a wide viewing angle due to the self-light emitting type, and high visibility, whereby in view of space saving and portability, it has attracted attention.

For example, an EL element is known in which a thin organic film is formed via deposition of organic compounds (for example, Applied Physics Letters, p. 913-(1987)). The organic EL element described in the above reference incorporates a laminated layer structure of electron transporting materials and positive hole transporting materials, whereby it realizes significant enhancement of light emission characteristics compared to conventional monolayer type elements. The above laminated layer type element is formed via deposition of low molecular weight organic materials as an element material.

Further disclosed is a technique in which an element is formed via deposition of organic molecules having a repeated unit of at most 10 which are prepared by polymerization of compounds having a polymerizable group (refer, for example, to Patent Document 1). Still further disclosed is a technique in which a first layer is formed via polymerization of compounds having a polymerizable group, and subsequently a second layer is formed thereon via polymerization of compounds having a polymerizable group (refer, for example, to Patent Document 1).

However, such forming methods employing deposition display major problems such as poor utilization efficiency of materials, an increase in space, and the insufficient accuracy during the production process of the elements.

Nature, 397 (1999) 121 describes that π electron conjugation based polymers such as polyparaphenylene vinylene (PPV), and derivatives thereof, may be employed as a light emitting material. Some of these have been employed as a clock backlight. These polymer based materials capable of being subjected to film formation via a casting method exhibit not only advantages in the production process but also advantages in excellent durability compared to low molecular weight light emitting materials. However, organic polymer materials when employed via a coating method, exhibit disadvantages such as low solubility in solvents and low light emission efficiency. In order to overcome these drawbacks, a method is available in which a polymer precursor is employed and polymers are formed after coating to become insoluble, whereby elution is minimized. As the above example, it is possible to cite a method proposed by Cambridge Display Technology Co. in which PPV is employed as a precursor. The above method is detailed on pages 73—of Organic Electro-Luminescent Materials and Devices, 1997. However, since in this method, polymer structures are limited, it is not possible to apply it to various compounds to form a light emitting element.

Further, another method is available in which after casting employing monomers, elution is minimized in such a manner that the monomers are polymerized to become insoluble (refer, for example, to Patent Documents 3 and 4). By employing the above methods, it becomes possible to employ a laminated layer structure, whereby light emitting efficiency is improved. However, problems have still remained in which due to insufficient enhancement of the light emitting efficiency, dark spots tend to occur, and the life of the element is not long enough due to distortion of the boundary.

Patent Document 1: Japanese Patent Publication Open to Public Inspection (hereinafter referred to as JP-A) No. 5-247547
Patent Document 2: JP-A No. 2004-103401
Patent Document 3: JP-A No. 2003-73666
Patent Document 4: JP-A No. 2003-86377

DISCLOSURE OF THE INVENTION

Problems to be Solved by the Invention

In view of the foregoing, the present invention was achieved. An object of the present invention is to provide an organic electroluminescence element which is structured as multiple layers, emits light at excellent light emission efficiency, minimizes dark spots and exhibits long life, and a display device, as well as a lighting device using the same.

Means to Solve the Problems

The above object of the present invention was achieved employing the following embodiments.

1. In an organic electroluminescence element which incorporates a substrate having thereon an anode and a cathode and which incorporates a plurality of organic layers between the aforesaid anode and cathode, wherein at least one of the aforesaid organic layers is a first organic layer incorporating a compound having at most 10 repeating units, the first organic layer being prepared by coating the compound having at least one polymerizable group, followed by polymerization.

2. The organic electroluminescence element described in 1. above, wherein a second organic layer incorporating a compound having at most 10 repeating units is applied onto the aforesaid first organic layer, and then followed by polymerization, the second organic layer being prepared by coating the compound incorporating at least one polymerizable group onto the aforesaid first organic layer.

3. In an organic electroluminescence element which incorporates a substrate having thereon an anode and a cathode and which incorporates a plurality of organic layers between the aforesaid anode and cathode, an organic electroluminescence element, wherein a first organic layer is formed by coating a compound having a polymerizable group or a reactive group, followed by polymerization, and a second organic layer is present which is formed by coating a compound having a polymerizable group or a reactive group onto the aforesaid first layer, followed by polymerization, and a portion of an interface of each of the organic layers is bonded via a covalent bond.

4. The organic electroluminescence element described in any one of 1.-3. above, wherein the aforesaid polymerizable group is a vinyl group.

5. The organic electroluminescence element described in any one of 1.-4. above, wherein the aforesaid coating is carried out employing an ink-jet recording method.

6. The organic electroluminescence element described in any one of 1.-5. above, wherein the aforesaid polymerization is performed via exposure to energy rays.

7. The organic electroluminescence element described in any one of 1.-6. above, wherein the aforesaid exposure to energy rays is exposure to ultraviolet rays, electrons, ions, heat, radical beams, or radioactive rays.

8. The organic electroluminescence element described in any one of 2.-7. above, wherein the compound incorporated in the aforesaid first organic layer is an aromatic compound having a tertiary amine group and the compound incorporated in the aforesaid second organic layer is a compound having an organic metal complex structure.

9. The organic electroluminescence element described in any one of 2.-8. above, wherein the aforesaid first or second organic layer further incorporates a phosphorescent compound.

10. The organic electroluminescence element described in any one of 2.-9. above, wherein the aforesaid first organic layer is an electron transporting layer and the aforesaid second organic layer is a positive hole transporting layer.

11. The organic electroluminescence element described in any one of 1.-10. above, wherein the aforesaid substrate is a transparent gas barrier film.

12. The organic electroluminescence element described in any one of 1.-11. above, wherein the emitted light is white.

13. A display device incorporating the organic electroluminescence element described in 12. above.

14. A lighting device incorporating the electroluminescence element described in 12. above.

15. A display device incorporating the lighting device described in 14. above and a liquid crystal element as a display means.

Effects of the Invention

Employing the present invention, it has become possible to provide a multilayered organic electroluminescence element which results in light emission of excellent light emission efficiency, minimized dark spot, and long service life, as well as a display device and a lighting device using the same.

BRIEF DESCRIPTION OF THE DRAWINGS

FIG. 2 is a schematic view showing one example of an atmospheric pressure discharge treatment apparatus of a system in which a substrate is processed between counter electrodes which are applicable for the present invention.

FIG. 3 is a view showing discharge of organic EL element OLED1-1 of the present invention, and a film casting process.

Figure 1:
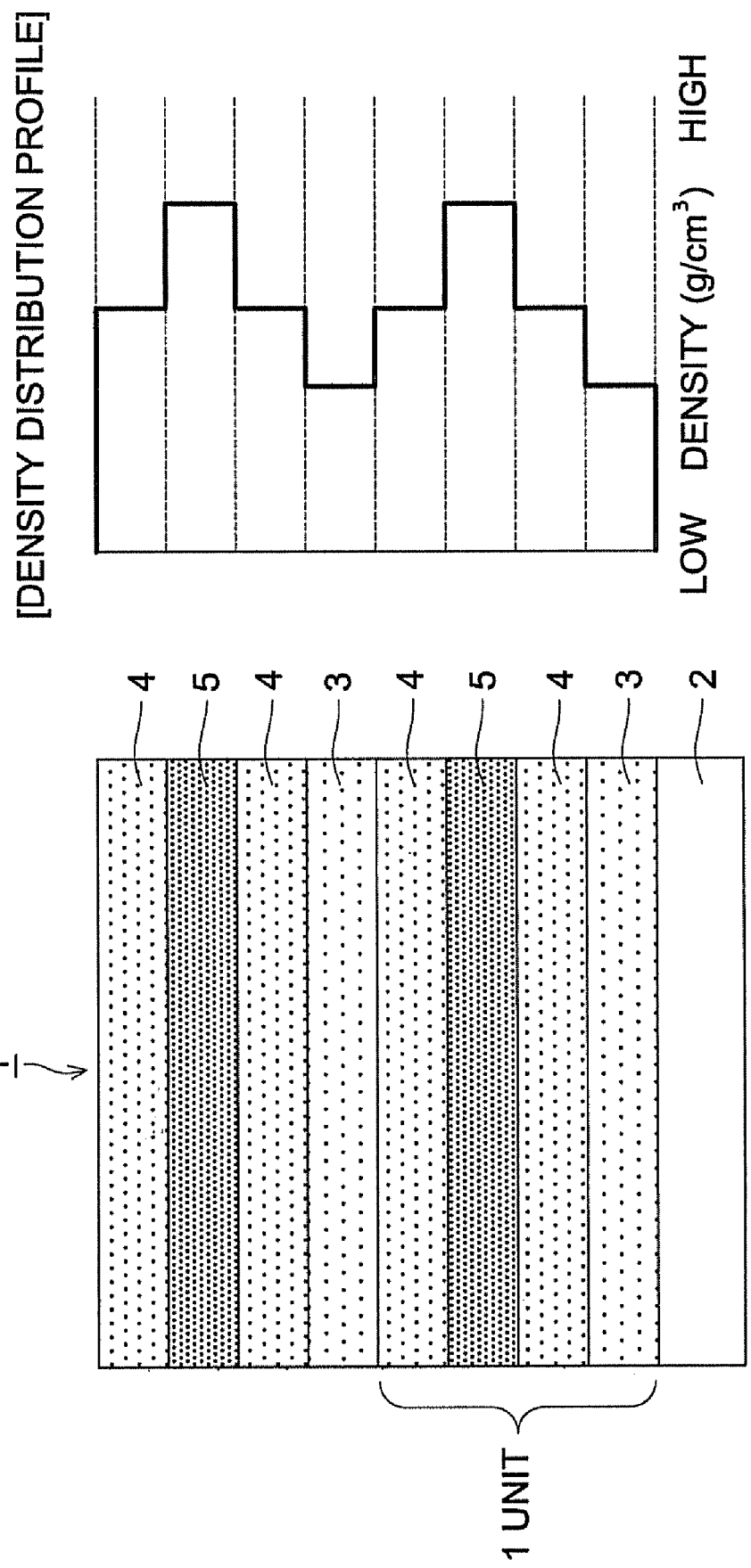
FIG. 1 is a schematic view showing of the layer configuration of the gas barrier film according to the present invention and one example of its density profile.
Figure 4:
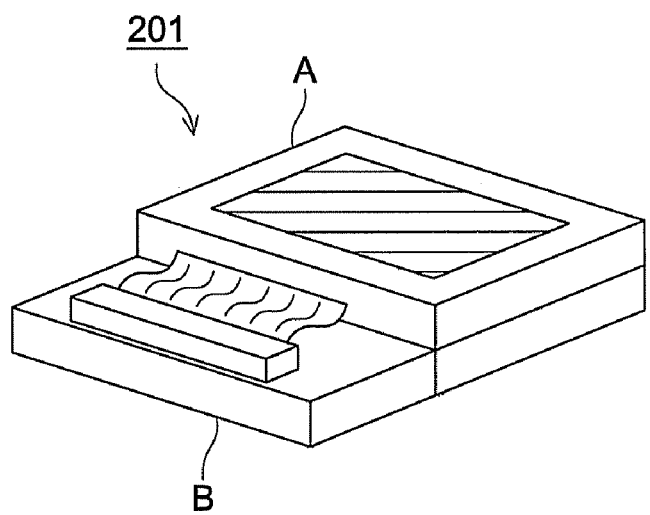
FIG. 4 is a schematic view showing one example of a display device composed of the organic EL element of the present invention.

DESCRIPTION OF THE DESIGNATIONS 30 plasma discharge treatment chamber
25 and 35 roller electrode
36 electrode
41 and 42 power sources
51 gas supplying unit
55 electrode cooling unit
100 ITO substrate
111 positive hole transporting layer
112 electron transporting layer
113 and 303 cathodes
114 gas barrier film
10 ink-jet system head
D droplet
201 display
203 pixel
205 scanning line
A display section
B control section
302 glass cover
306 organic EL layer
307 glass substrate fitted with transparent electrode
308 nitrogen gas
309 water catching agent

BEST MODE FOR CARRYING OUT THE INVENTION

Each of the constituting requirements of the present invention will now be detailed.

The basic feature of the present invention is formation of an organic layer incorporating organic molecules of a repeating unit of at most 10 in such a manner that a compound (organic EL component) having at least one polymerizable group is coated and the resulting coating is exposed to energy radiation to undergo polymerization. Further, when an organic layer is coated thereon, a preferable embodiment is that after forming a first organic layer, a second organic layer is formed via the same process as coating of a compound having at least one polymerizable group followed by polymerization. Further, the third feature is that when lamination is carried out according to the present invention, the first and second organic layers are partially joined via a covalent bond at the resulting interface. An additional feature is that the organic layer is formed via a coating system, and it is specifically preferable that the organic layer is formed employing an ink-jet recording system.

Polymerization reaction according to the present invention may be performed via exposure to energy radiation. Examples of such energy radiation include ultraviolet rays, electrons, ions, heat, radical beams, and radioactive rays. Of these, electronic energy refers to an electric current which is supplied during driving of light emitting elements. Specifically, polymerization reaction is initiated by anion radicals of polymerizable compounds formed by electrons injected from an anode, or radical cations of polymerizable compounds formed by positive holes injected from an anode. In addition, repeating unit, as described in the present invention, is defined as a number average degree of polymerization.

In compounds having at least one polymerizable group according to the present invention, examples of the polymerizable groups include a vinyl group, an epoxy group, and an oxetane group. In the present invention, by polymerizing compounds having at least one polymerizable group, it is possible to easily prepare organic molecules having at most 10 repeating units in such a manner that monomers undergo polymerization under polymerizing conditions in which reaction termination tends to occur. Listed as methods are, for example, a method to control polymerization initiators or catalyst concentration, a method to simultaneously employ chain transfer agents or polymerization terminating agents, or a method to control the exposure energy amount of ultraviolet rays, electrons, ions, heat, radical beams or radioactive rays.

Examples of radical polymerization initiators employed in the present invention include azo based initiators such as 2,2'-azobisbutyronitrile, 2,2'azobiscyclohexanecarbonitrile, 1,1'-azobis(cyclohexane-1-carbonitrile, 2,2'-azobis(2-methylbytyronitrile), 2,2'-azobis(2,4-dimethylvaleronitrile), 2,2'-azobis(4-methoxy-2,4-dimethylvaleronitrile), 4,4'-azobis(4-cyanovaleric acid), 2,2'-azobisisobutyric acid dimethyl, 2,2'-azobis(2-methylpropionamidooxime), 2,2'-azobis(2-(2-imidazoline-2-yl)propane), or 2,2'-azobis(2,4,4-trimethylpentane); peroxide based initiators such as benzoyl peroxide, di-t-butyl peroxide, t-butylhydro peroxide, or cumenehydro peroxide; aromatic carbonyl based initiators such as diethoxyacetophenone, 2-hydroxy-2-methyl-1-phenylpropane-1-one, benzyldimethylketal, benzyl-β-methoxyethylacetal, 1-(4-isopropylphenyl-2-hydroxy-2-methylpropane-1-one, 4-(2-hydroxyethoxy)phenyl-(2-hydroxy-2-propyl)ketone, 1-hydroxycyclohexyl phenyl ketone, 4-phenoxydichloroacetophenone, 4-t-butyldichloroacetophenone, 4-t-butyltrochloroacetophenone, or 1-(4-dodecylphenyl)-2-hydroxy-2-methylpropane-1-one. Further employed may be disulfide based initiators such as tetraethylthiirane disulfide, nitroxyl initiators such as 2,2,6,6-tetramethylpyperidine-1-oxyl, and living radical polymerization initiators such as a 4,4'-di-butyl-2,2'-bipyridine copper complex-methyl trichloroacetate composite.

Examples of acid catalysts, which are employed in the present invention, include clay such as active clay or acid clay; mineral acids such as sulfuric acid or hydrochloric acid; organic acids such as p-toluenesulfonic acid, or trifluoroacetic acid; Lewis acids such as aluminum chloride, ferric chloride, stannic chloride, titanium trichloride, titanium tetrachloride, boron trifluoride, hydrogen fluoride, boron tribromide, aluminum bromide, gallium chloride, or gallium bromide; and further solid acids such as zeolite, silica, alumina, silica-alumina, cation exchange resins, or heteropoly acids (for example, phosphorous tungstic acid, phosphorous molybdic acid, silicotungstic acid, and silicomolybdic acid.

Cited as basic catalysts which are employed in the present invention may, for example, be alkaline metal carbonates such as $Li_2O_3$, $Na_2CO_3$, or $K_2CO_3$; alkaline earth metal carbonates such as $BaCO_3$ or $CaCO_3$; alkaline metal oxides such as $LiO_2$, $Na_2O$, or $K_2O$; alkaline earth metal oxides such as BaO or CaO; alkaline metals such as Na or K; alkaline metal hydroxides such as sodium hydroxide or potassium hydroxide; and alkoxides of sodium, potassium, rubidium and cesium.

In the present invention, it is possible to control the molecular weight of the resulting oligomer depending on the used amount of polymerization initiators or catalysts. Namely, when the used amount of the polymerization initiators or catalysts increases with respect to compounds having at least one polymerizable group, which are monomers, the molecular weight of the resulting oligomer decreases. The used amount of the polymerization initiators or catalysts is commonly in the range of 0.1-100% by weight with respect to the compound having at least one polymerizable group, but is preferably in the range of 1-20% by weight.

Employed as a chain transfer agent or a polymerization terminating agent may, for example, be acids such as hydrochloric acid, sulfuric acid, or acetic acid, polyhalogenated methane, halogenated hydrocarbon, mercaptans, α-methylstyrene dimers, active hydrogen compounds such as alcohol, 2,2-disubstituted olefin such as 2,4-diphenyl-4-methyl-1-pentane, and transition metal complexes such as cobalt complexes. The used amount of the chain transfer agents and polymerization terminating agents is preferably 0.01-0.5 in terms of mol ratio with respect to the compound having at least one polymerizable group.

Specific examples of compounds having at least one polymerizable group will now be listed; however, the present invention is not limited thereto.

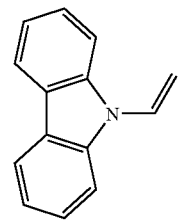

A1

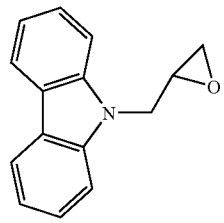

A2

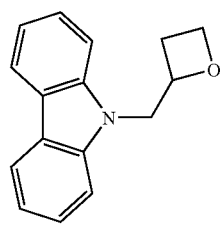

A3

-continued
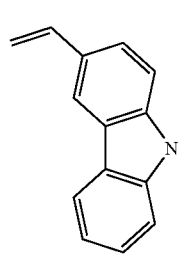
A4
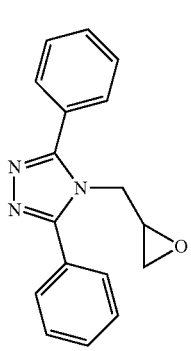
A8
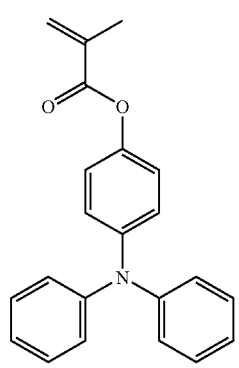
A5
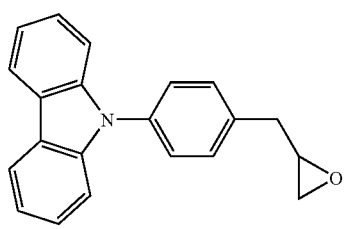
A9
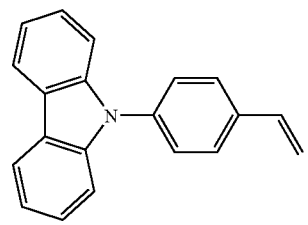
A10
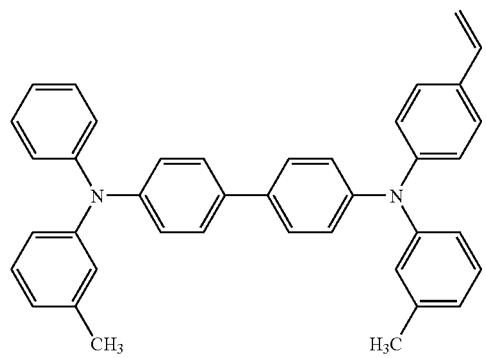
A6
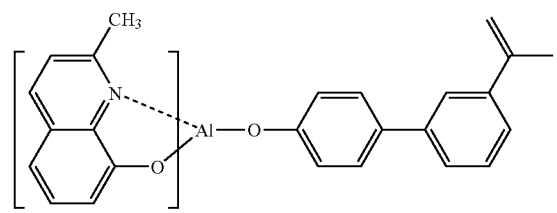
A11
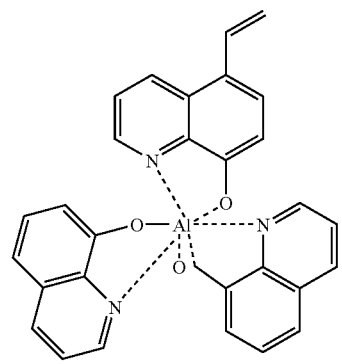
A12
A7

-continued

A13
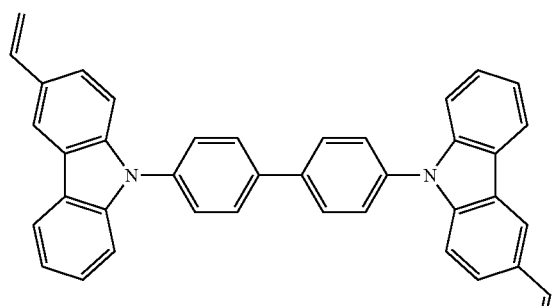

A14
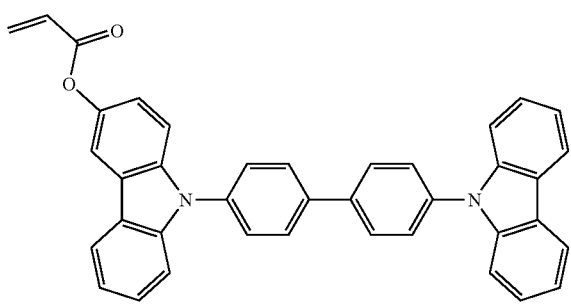

A15
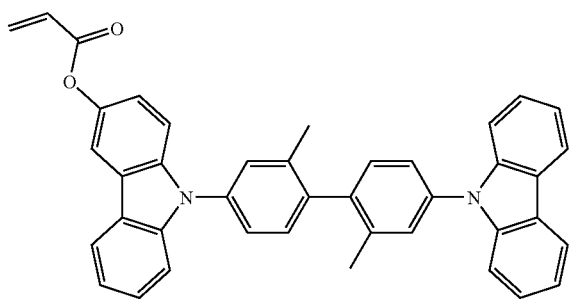

A16
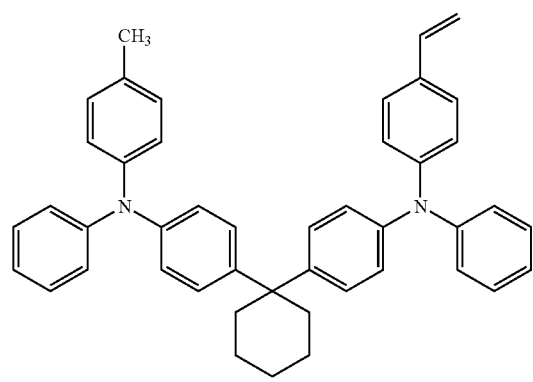

-continued

A17
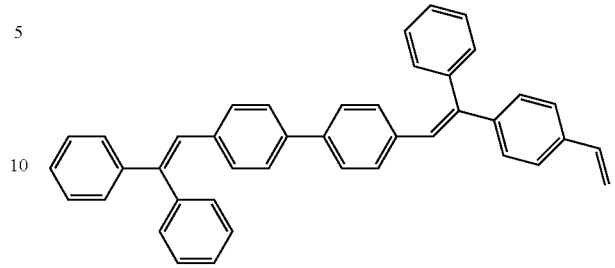

A18
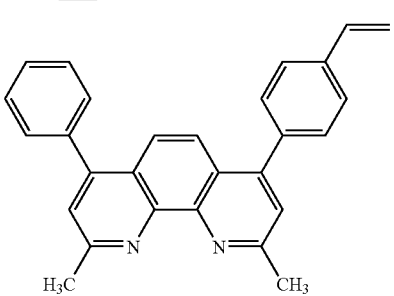

In cases in which compounds are employed, which have a polymerizable group or a reactive group, according to the present invention, a feature is that some of the interfaces of each of the organic layers are joined via a covalent bond. Specifically, it is essential that conditions are realized so that the interface formed between the first organic layer and the second organic layer, each of which functions differently, is joined via a bond such as a covalent bond.

In order to realize the above, it is preferable that compounds having self-polymerizable groups, such as a vinyl group or an epoxy group, are employed to constitute each of the first and second organic layers, or a compound having a reactive group, listed in following Group I, is employed in the first organic layer, while a compound having a reactive group, listed in following Group II, are employed in the second organic layer.

Group I
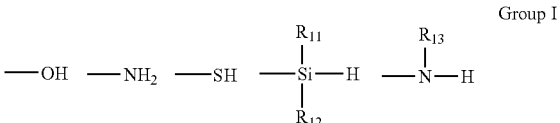
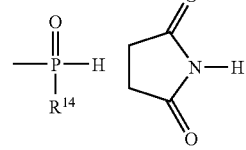

Group II
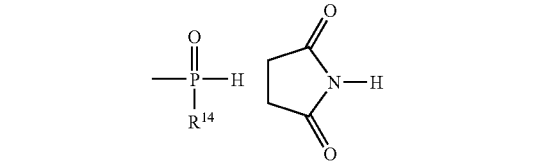
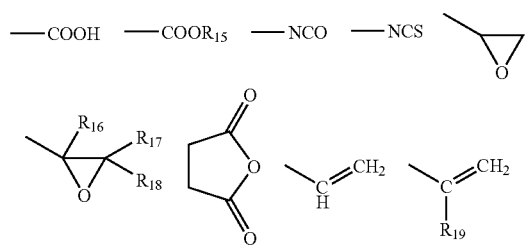

-continued

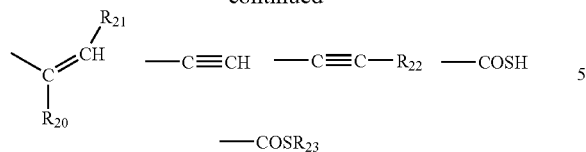

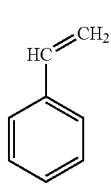
B3

Of combinations of the above reactive groups, preferred is a combination capable of undergoing addition reaction without formation of $H_2O$.

Compounds having a polymerizable group or a reactive group according to the present invention, as described herein, refer to compounds capable of forming polymers in such a way that single compounds react with each other or compounds capable of forming a covalent bond in such a manner that two differing compounds reacts with each other. Preferred compounds include those which result in no release of molecules during polymerization reaction, or compounds having a functional group such as an epoxy group capable of undergoing ring-opening polymerization, but the most preferred compounds include those having a vinyl group.

In the present invention, to enhance performance of the element, it is preferable that the function of the first organic layer differs from that of the second organic layer. Further, it is preferable that the positive hole transporting materials, and electron transporting materials described below, as well as the structure listed as an example of the light emitting layer, are provided individually.

The compounds which are employed in the first organic layer or the second organic layer are preferably either of the compounds having an aromatic tertiary amine structure or an organic metal complex structure. However, it is more preferable that the compounds employed in the first organic layer have an aromatic tertiary amine structure and the compounds employed in the second organic layer have an organic metal complex structure.

Examples of compounds having a polymerizable group or a reactive group will now be listed, however, the present invention is not limited thereto.

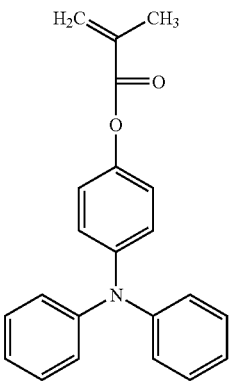
B4

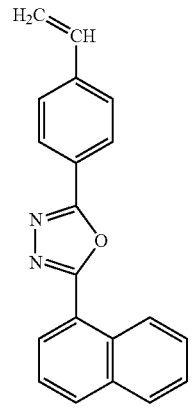
B5

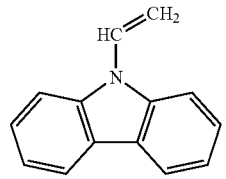
B1

B2

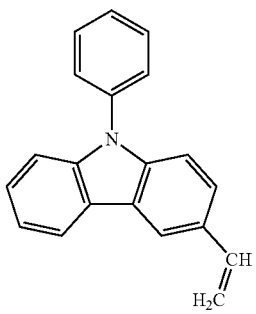

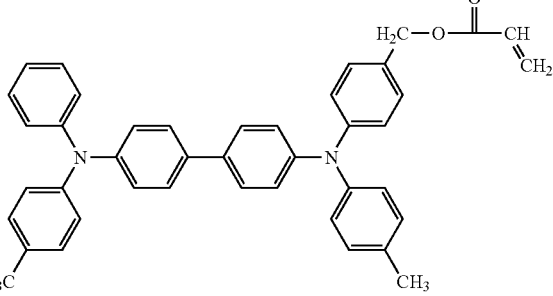
B6

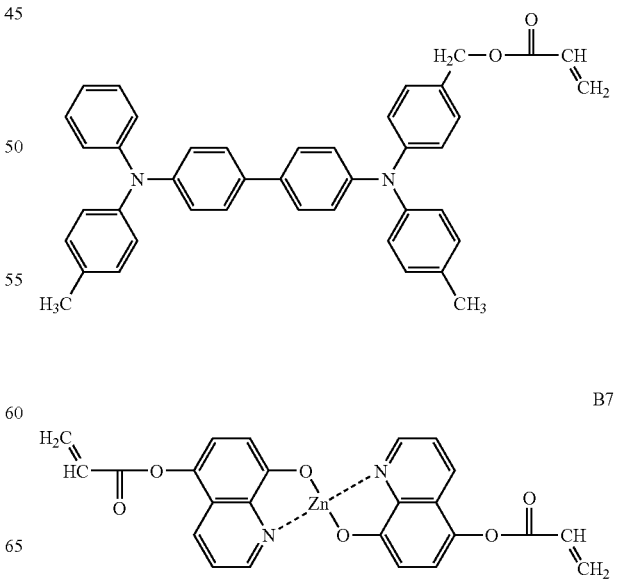
B7

-continued
B8
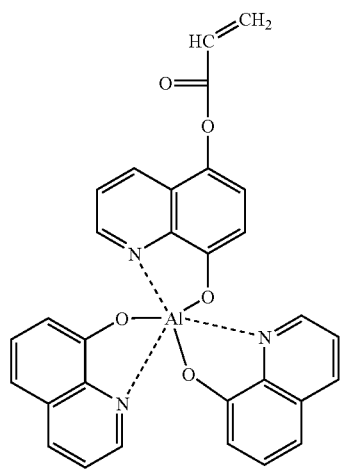
B9
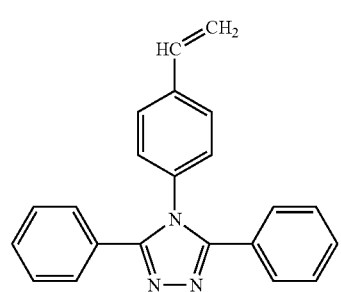
B10
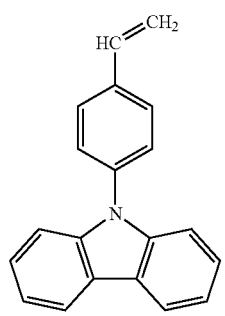
B11
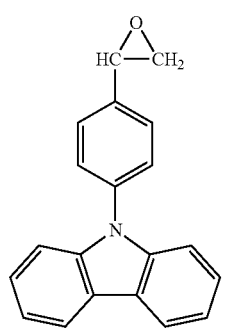
-continued
B12
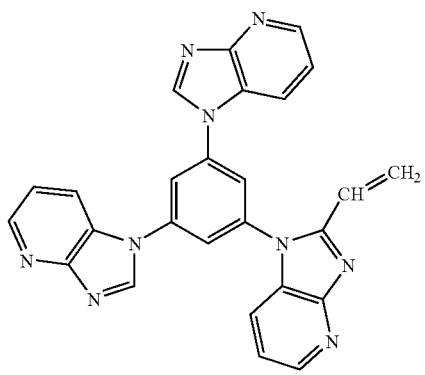
B13
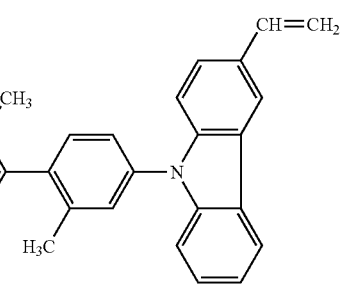
B14
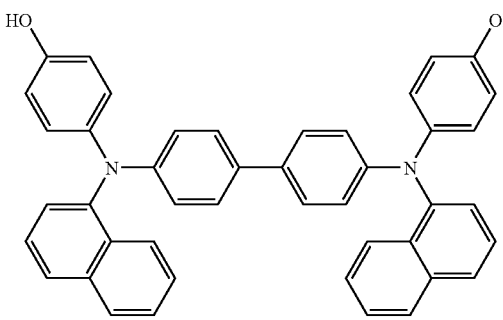
B15
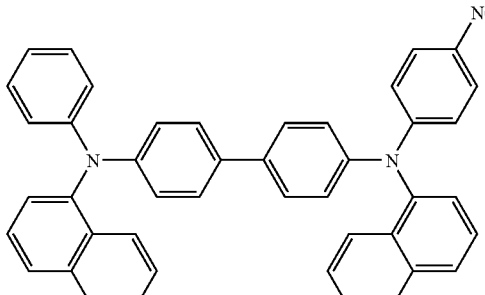

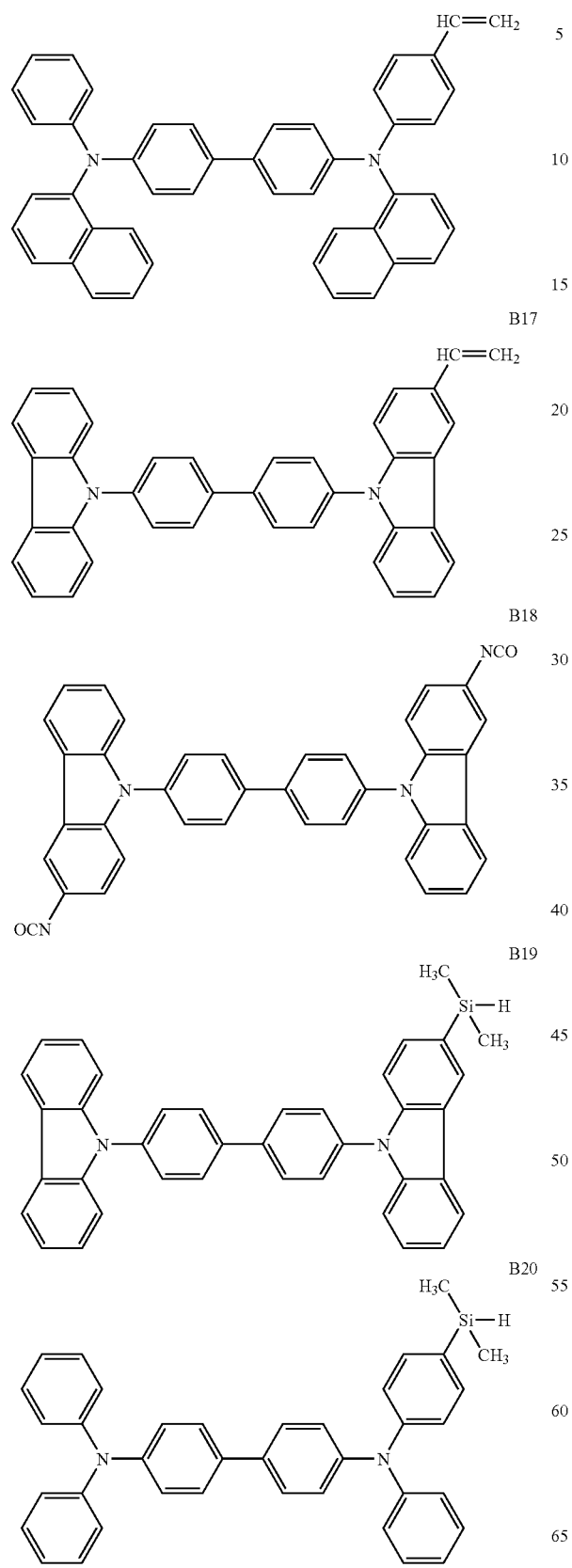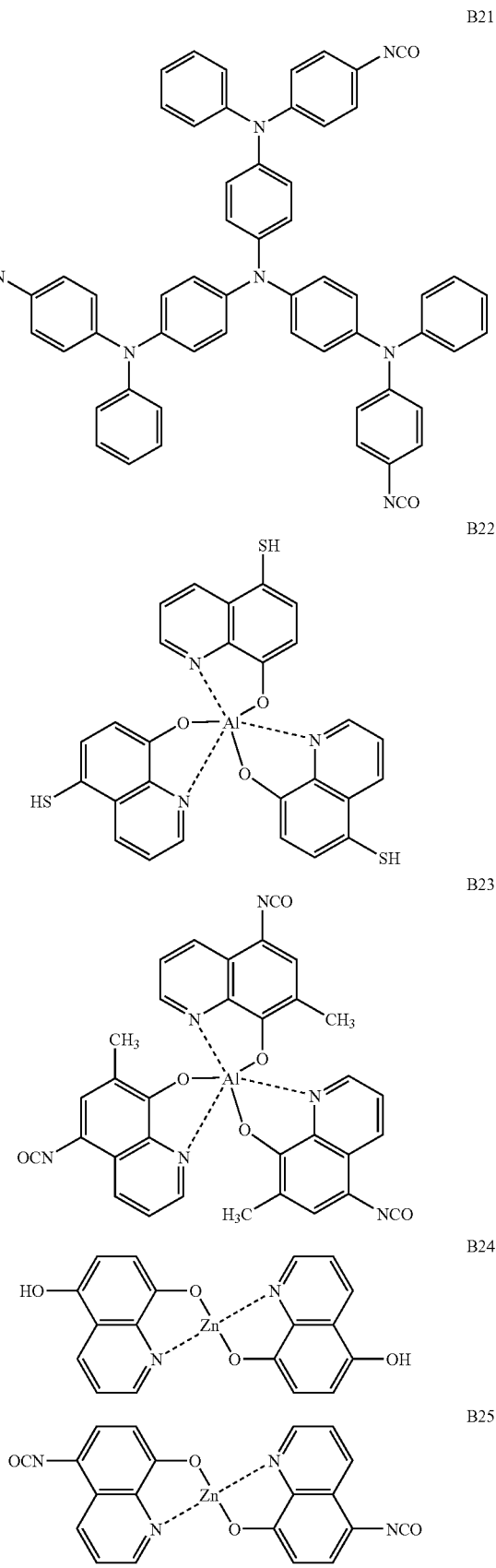

-continued

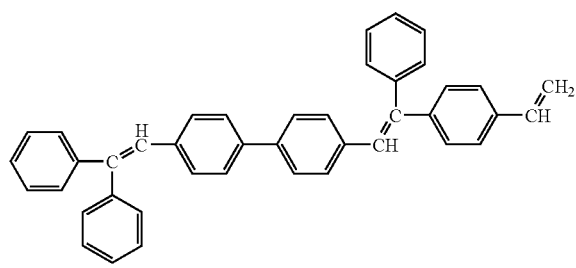

B26

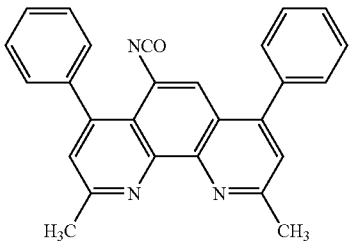

B31

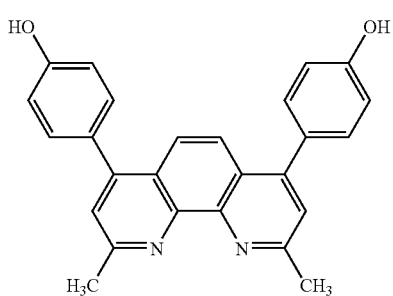

B27

B28

B29

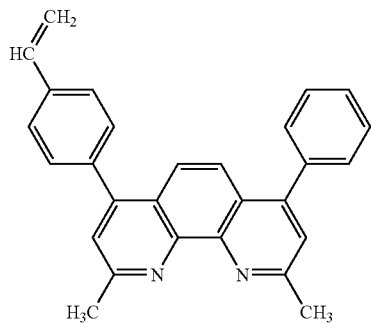

B30

The compounds according to the present invention are incorporated as a major component in at least two organic layers constituting the organic EL element of the present invention, but other appropriate compounds may be incorporated.

In the organic EL element of the present invention, it is preferable that coating (formation) of each of the above organic layers represented by the first or second organic layer is carried out via an ink-jet recording systems.

An ink-jet recording apparatus applicable to the present invention is constituted of an energy generating means to discharge a solution incorporating compounds having at least one polymerizable group to form the organic layer according to the present invention, an ink-jet head provided with nozzles to discharge the above solution, an electric circuit to provide signals to drive the ink-jet head, an insufficient discharge recovering means (also called a maintenance means) to secure stable discharge of the above solution incorporating compounds having at least one polymerizable group, and a capping means to cover the nozzle surface employing a capping member so that the above solution is not solidified due to evaporation when the ink-jet head is in the standby mode during non-use periods.

Listed as discharge systems of the employed ink-jet head are an electrical-mechanical conversion system (for example, a single-cavity type, a double-cavity type, a vendor type, a piston type, a share mode type, and a shared wall type), an electrical-thermal conversion system (for example, a thermal ink-jet type, and a BUBBLE INK-JET (being a registered trade mark) type, an electrostatic attracting system (for example, an electric field controlling type, and a slit-jet type), and an electric discharge type (for example, a spark-jet type). Of these, preferred is the electrical-mechanical conversion system, but any of them are employable.

Further, it is preferable that in the organic EL element of the present invention, after coating (forming) each of the organic layers represented by the first or second organic layer according to the present invention, polymerization is performed via exposure to energy rays, which are preferably any of the ultraviolet rays, electrons, ions, heat, radical beams and radioactive rays. Employed as an ultraviolet ray source may be mercury lamps, metal halide lamps, excimer lamps, and ultraviolet ray laser-LEDs. Further, an electron beam exposure apparatus is detailed in "UV-EB Koka Gijutu no Tenkai (Development of UV-EB Curing Technology)" (edited by Radotech Kenkyu Kai, published by CMC Co., page 95 1999). Recently, a down-sized electron beam exposure apparatus has been introduced in Toso Gijutsu, October 2001, page 90. The electron beam exposure apparatus employed in the present invention is not particularly limited, but as an electron beam accelerator for such an electron beam exposure, commonly, a curtain beam system apparatus is effectively employed which is relatively inexpensive and results in relatively high output.

During exposure to electron beams, acceleration voltage is preferably 100-300 kV, while the absorption dose is preferably 0.5-10 Mrad.

The organic EL element of the present invention will now be described.

Examples of compounds incorporated in the organic EL element of the present invention include fluorescent compounds and phosphorescent compounds, whereby light emission of the organic EL element is realized via incorporated fluorescent or phosphorescent compounds. Preferred as the fluorescent compounds are those of a high quantum yield employed in laser dyes. Further, in recent years, an organic EL element employing phosphorescent emission from an excited triplet state is reported from Princeton University (M. A. Baldo et al., Nature, Volume 395, pages 151-154 (1998)), which receives attention, since the light emission efficiency is basically greater by a factor of 4, compared to the organic EL element employing fluorescent emission from an excited singlet state. In the present invention, in terms of light emission efficiency, incorporation of phosphorescent compounds is preferred.

Preferred fluorescent compounds are those which exhibit a high fluorescence quantum yield in the solution state, wherein fluorescence quantum yield is preferably at least 10%, but is more preferably at least 30%. Specific fluorescent compounds include coumarin based dyes, pyran based dyes, cyanine based dyes, croconium based dyes, squarylium based dyes, oxobenzanthracene based dyes, fluorescein based dyes, rhodamine based dyes, pyrylium based dyes, perylene based dyes, stilbene based dyes, polythiophene based dyes, and rare earth metal complex based phosphors. It is possible to determine the fluorescence quantum yield employing the method described on page 362 of Bunko II of Dai 4 Han Jikken Kagaku Koza (4th Edition, Lectures of Experimental Chemistry) (1992 Edition, Maruzen).

Phosphorescent compounds, as described in the present invention, are those which are observed for light emission from an excited triplet state and which result in a phosphorescence quantum yield of at least 0.001 at 25° C. The phosphorescence quantum yield is preferably at least 0.01, but is more preferably at least 0.1. It is possible to determine the above phosphorescence quantum yield employing the method described on page 398 of Bunko II of Dai 4 Han Jikken Kagaku Koza (4th Edition, Lectures of Experimental Chemistry) (1992 Edition, Maruzen). Phosphorescent compounds may be employed in the present invention if the above phosphorescence quantum yield is realized in any of the appropriate solvents.

Phosphorescent compounds employed in the present invention are preferably complex based compounds incorporating any of the Group III metals in the periodic table. More preferred compounds include iridium compounds, osmium compounds, or platinum compounds (being platinum complex based compounds), and of these, the iridium compounds are most preferred.

Specific examples of the phosphorescent compounds employed in the present invention will now be listed; however the present invention is not limited thereto. It is possible to synthesize these compounds employing the methods, for example, described in Inorg. Chem., Volume 40, 1704-1711. Further, fluorescent and phosphorescent compounds may incorporate either a polymerizable group or a reactive group.

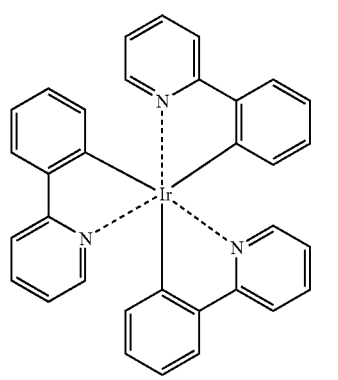

Ir-1

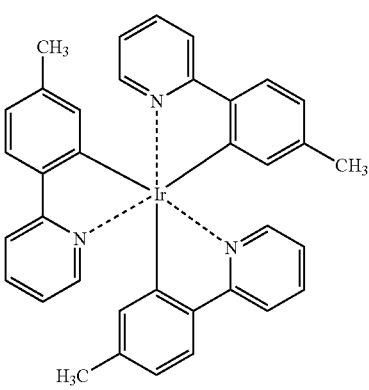

Ir-2

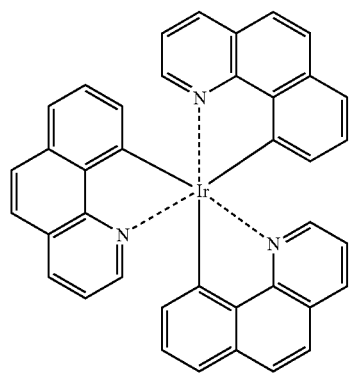

Ir-3

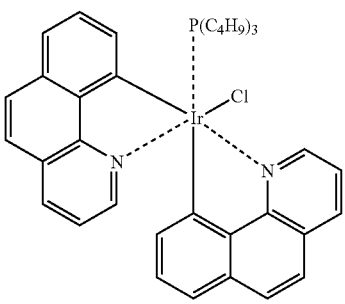

Ir-4

-continued
Ir-5
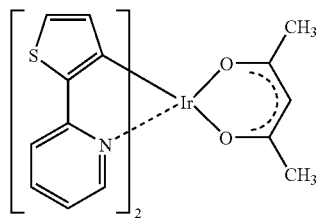
Ir-6
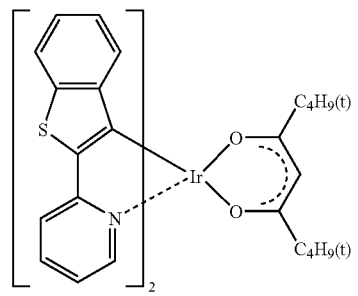
Ir-7
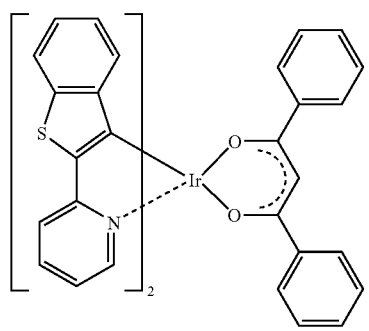
Ir-8
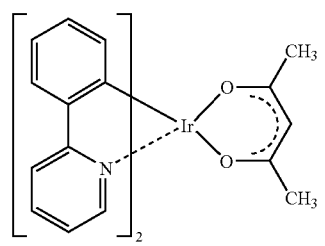
Ir-9
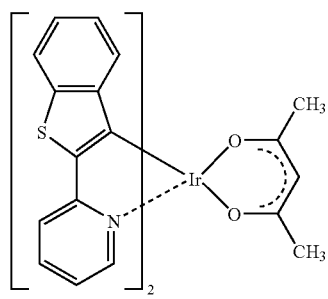
Ir-10
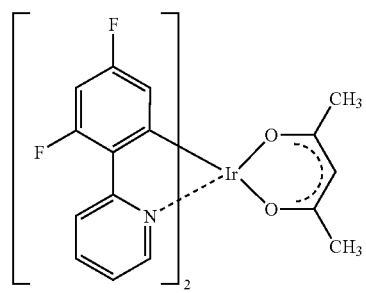
Ir-11
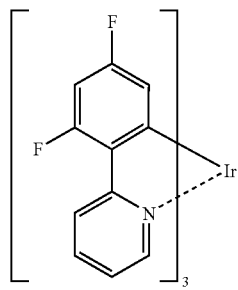
Ir-12
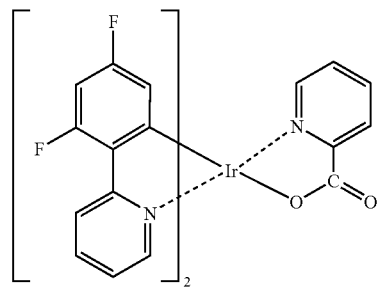
Ir-13
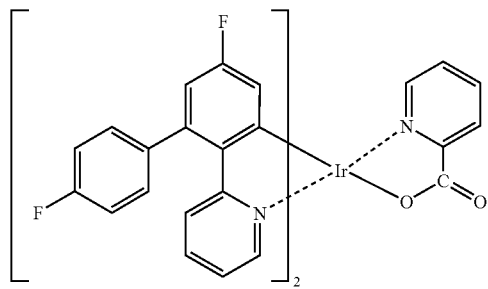
Pt-1
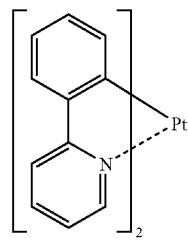

-continued
Pt-2
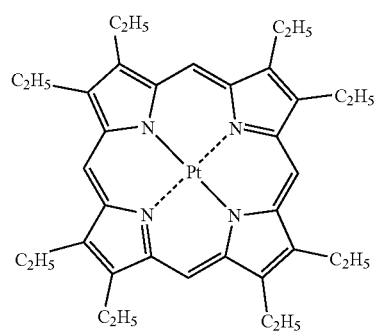
A-1
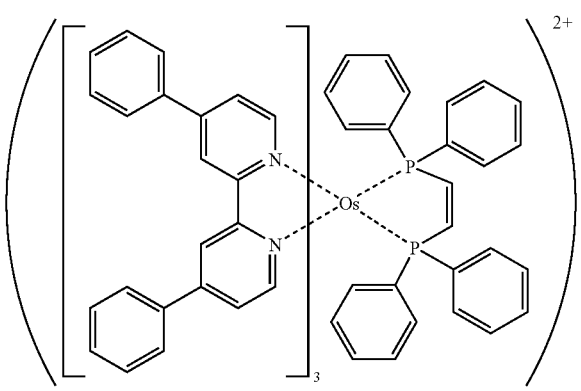
D-1
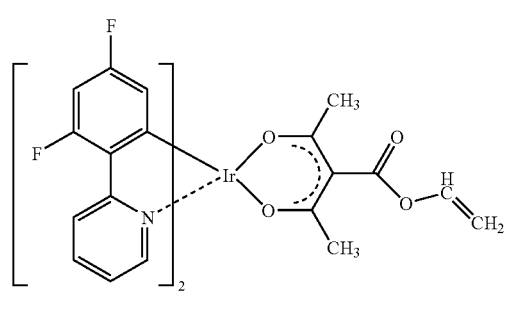
D-2
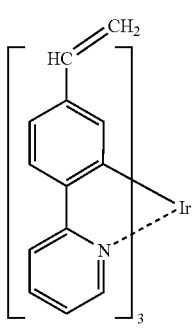
D-3
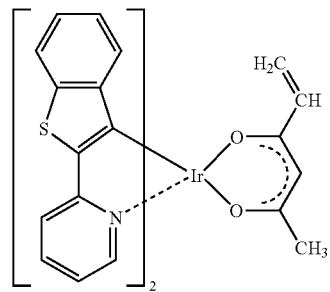
D-4
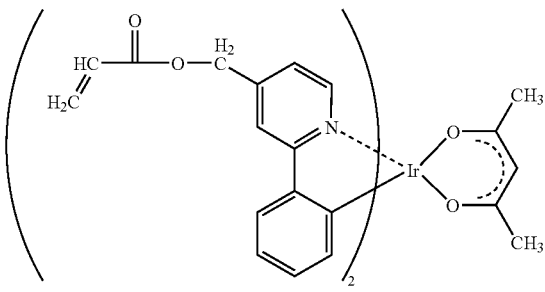
D-5
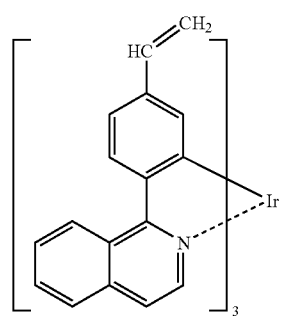
D-6
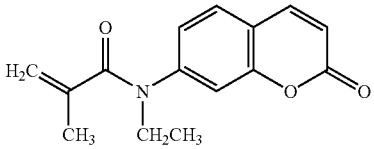

-continued

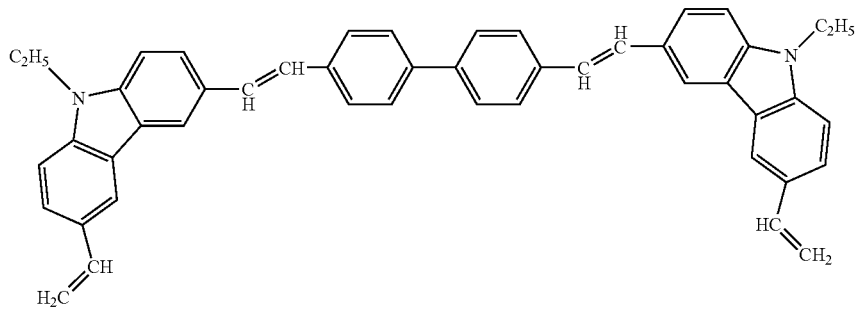

D-7

The layer configuration of the organic electroluminescence element (being the organic EL element) of the present invention will now be described.

The light emitting layer according to the present invention refers, in a broad sense, to the layer which emits light when an electric current is passed through electrodes composed of a cathode and an anode and specifically refers to the layer incorporating compounds which emit light when passing through the electrodes composed of a cathode and an anode.

If desired, the organic EL element of the present invention incorporates, other than the light emitting layer, a positive hole transporting layer, an electron transporting layer, an anode buffer layer, and a cathode buffer layer, which are sandwiched between the cathode and anode. Specifically, the following structures are listed.

(i) anode/positive hole transporting layer/light emitting layer/cathode (ii) anode/light emitting layer/electron transporting layer/cathode (iii) anode/positive hole transporting layer/light emitting layer/electron transporting layer/cathode (iv) anode/anode buffer layer/positive hole transporting layer/light emitting layer/electron transporting layer/cathode buffer layer/cathode It is preferable that of a plurality of layers sandwiched between the electrodes (namely the anode and the cathode) which constitutes the above organic EL element, at least two adjacent layers are constituted of the first organic layer incorporating a first compound according to the present invention, and the second organic layer incorporating a second compound according to the present invention. Further, it is preferable to incorporate at least three organic layers between the cathode and the anode.

<<Light Emitting Layer>>

The light emitting layer related to the organic EL element of the present invention will now be described. The light emitting layer is the one which emits light via recombination of electrons and positive holes which are injected from the electrodes, the electron transporting layer, or the positive hole transporting layer, and light emitting portions may be within the light emitting layer or at the interface between the light emitting layer and the adjacent layer.

It is preferable that materials employed in the light emitting layer (hereinafter referred to as light emitting materials) are organic compounds or complexes which fluoresce or phosphoresce. Usable materials may be appropriately selected from those known in the art, which are employed in the light emitting layer of the organic EL element. Most of such light emitting materials are organic compounds, and it is possible to employ those described, for example, in Macromol. Synth. Volume 125, pages 17-25 depending on desired color tone.

In the organic EL element of the present invention, light emitting materials may simultaneously exhibit, other than light emitting performance, a positive hole transporting function and an electron transporting function, whereby it is possible to employ almost any positive hole transporting material and electron transporting material as a light emitting material. Light emitting materials may be polymer materials such as p-polyphenylene vinylene or polyfluorene, and further, employed may be polymer materials in which the above light emitting materials are introduced into a polymer chain or the above light emitting materials are employed as a main chain of the polymer.

Generally, in terms of performance of the elements, it is preferable to arrange the light emitting layer on the cathode side rather than in the positive hole transporting layer. Accordingly, compared to positive hole transporting materials, all materials employed in the light emitting layer relatively become electron transporting materials (under the definition of the present invention).

(Thickness of Light Emitting Layer)

Thickness of the light emitting layer, prepared as above is not particularly limited and appropriate ones may be chosen depending on the situation. However, it is preferable to control the thickness in the range of 5 nm-5 µm.

Described now will be other layers, which constitute the organic EL element in combination with light emitting layers such as a positive hole injecting layer, a positive hole transporting layer, an electron injecting layer, or an electron transporting layer.

<<Positive Hole Injecting Layer, Positive Hole Transporting Layer, Electron Injecting Layer, and Electron Transporting Layer>>

The positive hole injecting layer and the positive hole transporting layer employed in the present invention exhibit the function in which the positive holes injected from an anode are transferred to the light emitting layer. By arranging the above positive hole injecting layer and positive hole transporting layer between the anode and the light emitting layer, many positive holes are injected into the light emitting layer in a lower electric field, and further, electrons, which are injected into the light emitting layer from the cathode, the electron injecting layer or the electron transporting layer, are accumulated at the interface within the light emitting layer, due to the electron wall which exists at the interface between the light emitting layer and the positive hole injecting layer or the positive hole transporting layer, whereby an element exhibiting excellent light emitting performance such as enhanced light emitting efficiency is produced.

<<Positive Hole Injecting Materials and Positive Hole Transporting Materials>>

Materials of the positive hole injecting layer and positive hole transporting layer (hereinafter referred to as positive hole injecting material and positive hole transporting materials) are not particularly limited as long as they transport positive holes injected from the above anode to the light emitting layer. It is possible to employ any appropriate ones selected from those which are commonly employed as positive hole injecting transporting materials in photoconductive materials and which are conventionally employed in the positive hole injecting layer and the positive hole transporting layer in organic EL elements.

The above positive hole injecting materials and positive hole transporting materials exhibit any of the injection or transport of positive holes, or a barrier against electrons, and may be either organic or inorganic materials. Examples of the above positive hole injecting materials and positive hole transporting materials include triazole derivatives, oxadiazole derivatives, imidazole derivatives, polyarylalkane derivatives, pyrazoline derivatives, pyrazolone derivatives, phenylenediamine derivatives, arylamine derivatives, aminosubstituted chalcone derivatives, oxazole derivatives, styrylanthracene derivatives, fluorenone derivatives, hydrazone derivatives, stilbene derivatives, and silazane derivatives, as well as aniline based copolymers, and conductive polymer oligomers, especially thiophene oligomer.

It is possible to employ those materials described above as a positive hole injecting material and a positive hole transporting material. However, it is preferable to employ porphyrin compounds, aromatic tertiary amine compounds, styrylamine compounds, and it is particularly preferable to employ the aromatic tertiary amine compounds.

Typical examples of the above aromatic tertiary amine compounds and styrylamine compounds include N,N,N',N'-tetraphenyl-4,4'-diaminophenyl, N,N'-diphenyl-N,N'-bis(3-methylphenyl)-[1,1'-biphenyl]-4,4'-diamine (TPD), 2,2-bis(4-di-p-tolylaminophenyl)propane, 1,1-bis(4-di-p-tolylaminophenyl)cyclohexane, N,N,N',N'-tetra-p-tolyl-4,4'-diaminobiphenyl, 1,1-bis(4-di-p-tolylaminophenyl)-4-phenylcyclohexane, bis(4-dimethylamino-2-methylphenyl)phenylmethane, bis(4-di-p-tolylaminophenol)phenylmethane, N,N'-diphenyl-N,N'-di(4-methoxyphenyl)-4,4'diaminobiphenyl, N,N,N',N'-tetraphenyl-4,4'-diaminodiphenyl ether, 4,4'-bis(diphenylamino)quodriphenyl, N,N,N-tri(p-tolyl)amine, 4-(di-p-tolylamino)-4'-[4-(di-p-tolylamino)styryl]stilbene, 4-N,N-diphenylamino-(2-diphenylvinyl)benzene, 3-methoxy-4'-N,N-diphenylaminostyrylbenzene, and N-phenylcarbazole, as well as those having two condensed aromatic rings in the molecule, described in U.S. Pat. No. 5,061,569, such as 4,4'-bis[N-(1-naphthyl)-N-phenylamino]biphenyl (α-NPD), and 4,4',4''-tris[N-(3-methylphenyl)-N-phenylamino]triphenylamine (MTDATA) described in JP-A No. 4-308688, in which three triphenylamine units are connected in a star burst type. Further, it is possible to employ polymer materials in which any of the above materials are introduced in polymer chains or are employed as a principal chain of the polymer.

Alternatively, it is possible to employ inorganic compounds such as p type-Si or p type-SiC as a positive hole injecting material or a positive hole transporting material. It is also possible to form the above positive hole injecting layer and positive hole transporting layer in such a manner that the above positive hole injecting materials and positive hole transporting materials are formed as a thin film, employing the methods known in the art, such as a vacuum deposition method, a spin coating method, a casting method, or the LB method.

(Thickness of Positive Hole Injecting Layer and Thickness of Positive Hole Transporting Layer)

The thickness of positive hole injecting layers and positive hole transporting layers is not particularly limited, but is preferably in the range of 5 nm-5 µm. The above positive hole injecting layer or positive hole transporting layer may be constituted of a single layer composed of at least one of the above materials, or of a multilayer composed of a plurality of layers, each of which is composed of the same or a differing composition.

<<Electron Transporting Layer and Electron Transporting Materials>>

The electron transporting layer according to the present invention may exhibit a function in which electrons injected from a cathode are transferred to a light emitting layer. Any of the appropriate materials are selected from those known in the art and employed.

Examples of materials employed in the above electron transporting layer (hereinafter referred to as electron transporting materials) include nitro-substituted fluorene derivatives, diphenylquinone derivatives, thiopyran dioxide derivatives, heterocyclic tetracarboxylic anhydrides, carbodiimide, fluorenylidenemethane derivatives, anthraquinodimethane and anthrone derivatives, and oxadiazole derivatives, as well as organic metal complexes. Further employed as an electron transporting material may be thiadiazole derivatives which are prepared in such a manner that the oxygen atom of the oxadiazole ring of the above oxadiazole derivatives is substituted with a sulfur atom and quinoxaline derivatives having a quinoxaline ring known as an electron attractive group. Further, it is possible to employ polymer materials which are prepared by introducing these materials into the polymer chain or by employing these materials as the principal chain.

Further, employed as an electron transporting material may be metal complexes of 8-quinolinol derivatives such as tris(8-quinolinol)aluminum, tris(5,7-dichloro-8-quinilinol)aluminum, tris(5,7-dibromo-8-quinolinol)aluminum, tris(2-methyl-8-quinolinol)aluminum, tris(5-methyl-8-quinolinol) aluminum, and bis(8-quinolinol)zinc (Znq), as well as metal complexes in which the center metal of these metal complexes is replaced with In, Mg, Cu, Ca, Sn, Ga or Pb.

Other than the above, preferably employed as an electron transporting material may be metal-free or metal phthalocyanines, and those which are prepared by substituting the terminal of the above compound with an alkyl group or a sulfonic acid group. Further employed as an electron transporting material may be distyrylpyrazine derivatives, exemplified as the material of the light emitting layer, and employed as an electron transporting material may be n type-Si and n type-SiC in the same manner as for the positive hole injecting layer and the positive hole transporting layer.

(Thickness of Electron Transporting Layer)

The thickness of the electron transporting layer is not particularly limited, and it is preferable to prepare the above layer so that the resulting thickness is in the range of 5 nm-5 µm. The above electron transporting layer may be constituted of a single layer composed of at least one of the above materials or of a multilayer composed of a plurality of layers each of which is composed of the same or different composition.

Further, in the present invention, incorporation of fluorescent compounds is not limited to the light emitting layer. At least one fluorescent compound having the maximum fluorescence wavelength in the same region as that of the fluorescent compound, which becomes the host compound of the above phosphorescent compound, may be incorporated in the positive hole transporting layer or the electron transporting layer adjacent to the light emitting layer. By doing so, it is possible to further enhance the light emission efficiency of EL elements. The maximum fluorescence wavelength of these fluorescent compounds incorporated in the positive hole transporting layer and the electron transporting layer is preferably 350-440 nm, but is more preferably 390-410 nm, which is the same as for those incorporated in the light emitting layer.

Examples which are suitable for preparing the organic EL element of the present invention will now be described. As an example, described is the preparation method of an EL element structured as the above-cited anode/positive hole injecting layer/positive hole transporting layer/light emitting layer/ electron transporting layer/electron injecting layer/cathode.

Initially, an anode is prepared in such a manner that a thin film of at most 1 μm but preferably 10-200 nm, composed of desired electrode materials is formed on an appropriate substrate, employing a method such as deposition or sputtering. Subsequently, formed on the resulting anode is a thin film composed of a positive hole injecting layer, a positive hole transporting layer, a light emitting layer, an electron transporting layer/an electron injecting layer. Further, between the anode and the light emitting layer or the positive hole injecting layer, and between the cathode and the light emitting layer or the electron injecting layer, may be a buffer layer (being an organic interface layer).

The buffer layer, as described herein, refers to the layer arranged between the electrode and the organic layer for a decrease in driving voltage and enhancement in light emission efficiency. Buffer layers are detailed in Chapter 2 "Denkyoku Zaioryo (Electode Materials)" (pages 123-166) of Part 2 of "Yuuki EL Soshi to Sono Kogyoka Saizensen (Industrialization Front of Organic EL elements)", published by NTN Co., Nov. 30, 1998) and include an anode buffer layer and a cathode buffer layer.

The anode buffer layer is also detailed in JP-A Nos. 9-45479, 9-260062, and 8-288069, and specific examples include a phthalocyanine buffer layer represented by copper phthalocyanine, an oxide buffer layer represented by vanadium oxide, and a polymer buffer layer employing conductive polymers such as polyaniline (emraldine) or polythiophene.

The cathode buffer layer is also detailed in JP-A Nos. 6-325871, 9-17574, and 10-74586, and specific examples of which include a metal buffer layer represented by strontium and aluminum, an alkaline earth metal compound buffer layer represented by lithium fluoride, an alkaline earth metal compound buffer layer represented by magnesium fluoride, and an oxide buffer layer represented by aluminum oxide or lithium oxide.

It is preferable that the above buffer layer is structured as an extremely thin film. Though depending on components, its thickness is preferably in the range of 0.1-100 nm.

Further, other than the above basic constituting layers, if necessary, laminated may be layers exhibiting other functions. For example, incorporated may be functional layers such as the positive hole blocking (hole blocking) layer described in JP-A Nos. 11-204258 and 11-204359, as well as on page 237 of "Yuuki EL Soshi to Sono Kogyoka Saizensen (Industrialization Front of Organic EL elements)".

<<Electrodes>>

Electrodes of the organic EL element of the present invention will now be described. The electrodes of the organic EL element are composed of a cathode and an anode. Preferably employed as the anode in the organic EL element of the present invention are those in which metals of a relatively high work function (at least 4 eV), alloys, electrically conductive compounds and mixtures thereof are employed as an electrode material. Specific examples of such electrode materials include metals such as Au, and transparent electrically conductive materials such as CuI, indium tin oxide (ITO), $SnO_2$, or ZnO.

The above anode may be formed in such a manner that a thin film of the above electrode materials is formed via deposition or sputtering and then a pattern in the desired shape is formed via photolithography. Alternatively, in cases in which high accuracy of a pattern is not needed (approximately at least 100 μm), a pattern may be formed via a mask in the desired shape during deposition or sputtering of the above electrode materials. When light emission is realized from the above anode, it is preferable that the resulting transmittance is regulated to be at least 10%, or the sheet resistance as an anode is preferably at most several hundreds Ω/□. Further, though depending on materials, the selected film thickness is commonly in the range of 10 nm-1 μm, but is preferably in the range of 10-200 nm.

On the other hand, preferably employed as the cathode are metals of a relative low work function (at most 4 eV) (called electron injecting metals), alloys, electrically conductive compounds, and the mixtures thereof. Specific examples of such electrode materials include sodium, sodium-potassium alloy, magnesium, lithium, magnesium/copper mixtures, magnesium/silver mixtures, magnesium/aluminum mixtures, magnesium/indium mixtures, aluminum/aluminum oxide ($Al_2O_3$) mixtures, indium, lithium/aluminum mixtures, and rare earth metals. Of these, in view of electron injection properties and resistance against oxidation, appropriate are mixtures of electron injecting metals and other metals which exhibit larger value of the work function than the above metal and are stable, such as a magnesium/silver mixture, a magnesium/aluminum mixture, a magnesium/indium mixture, an aluminum/aluminum oxide ($Al_2O_3$) mixture, or a lithium/ aluminum mixture.

It is possible to form the thin film of the above cathode employing the above electrode materials via a method such as deposition or sputtering. Further, sheet resistance as the cathode is preferably at most several hundreds Ω/□, while the film thickness is commonly in the range of 10 nm-1 μm, but is preferably in the range of 50-200 nm. In order to transmit emitted light, it is advantageous that either the anode or the cathode, which is the organic EL element of the present invention, is transparent or translucent, since light emission efficiency is enhanced.

<<Display Device>>

The organic EL element may be employed as a kind of lamp, used for lighting or as an exposure light source, or as a display of a type such as a projection apparatus which projects images, or a type in which still images or moving images are directly viewed. When employed as a display device to reproduce moving images, the driving system may be either a simple matrix (being a passive matrix) system or an active matrix system. By employing at least two organic EL elements of the present invention, which exhibit different colors of emitted light, it is possible to prepare a full color display device.

<<Light Extracting Technology>>

In order to enhance light extracting efficiency of light emitted from the light emitting layer, in the organic El element of the present invention, the surface of the substrate may be subjected to prism or lens-like machining, or a prism sheet and a lens sheet may be adhered to the surface of the substrate.

The organic EL element of the present invention may incorporate a low refractive index layer between the transparent electrode and the transparent substrate. A low refractive index layer may be composed of materials such as aerogel, porous silica, magnesium fluoride, and fluorine based polymers.

The refractive index of the transparent substrate is commonly about 1.5—about 1.7. Consequently, the refractive index of the low refractive index layer is preferably at most 1.5, but is more preferably at most 1.35. Further, the thickness of the low refractive index medium is preferably twice of the wavelength in the medium. The reason for this is that when the thickness of the low refractive index medium reaches approximately the wavelength of light in which electromagnetic waves exuded via evanescent enters into the substrate, effects of the low refractive index layer decrease.

The organic EL element of the present invention may have a diffraction grating between any of the layers or in the media (in the transparent substrate and the transparent electrode). It is preferable that the introduced diffraction grating exhibits a two-dimensional periodic refractive index. The reason for this is that since light emitted from the light emitting layer travels randomly in all directions, in a common one-dimensional diffraction grating, light which travels in the specified direction is only diffracted, whereby light extracting efficiency is not markedly enhanced. However, by converting the refractive index distribution to a two-dimensional distribution, light which travels in any direction is diffracted, whereby the light extracting efficiency increases. As noted above, the position for introduction of the diffraction grating may be between any of the layers or in the media (in the transparent substrate and in the transparent electrode). However, positions near the organic light emitting layer, where light is generated, is preferred. In such a case, the period of diffraction grating is preferably about ½—three times that of the wavelength of light in the medium. Arrangement of the diffraction grating is preferably repetition of two-dimensional arrangement such as a square lattice, a triangular lattice or a honeycomb lattice.

<<Gas Barrier Layer>>

In the organic EL element of the present invention, it is preferable that the substrate is a transparent gas barrier film having thereon a gas barrier layer. The composition of the gas barrier layer according to the present invention is not particularly limited as long as the layer inhibits transmission of oxygen and moisture. Specific materials constituting the gas barrier layer according to the present invention are preferably inorganic oxides, which may include silicon oxide, aluminum oxide, silicon oxide nitride, aluminum oxide nitride, magnesium oxide, zinc oxide, indium oxide, and tin oxide.

Further, the thickness of the gas barrier layer is appropriately selected though optimum conditions differ depending the type of materials used and their configuration, but is preferably in the range of 5-2,000 nm. When the thickness of the gas barrier layer is less than the above lower limit, it is not possible to prepare a uniform film whereby it becomes difficult to realize barring properties against gases. On the other hand, when the thickness of the gas barrier layer exceeds the above upper limit, it becomes difficult to maintain flexibility of the gas barrier film, whereby the gas barrier film may crack due to external factors such as folding and pulling after casting.

It is possible to form the gas barrier layer according to the present invention in such a manner that the raw materials, described below, are applied onto a substrate such as a flexible transparent film, employing a spray method, a spin coating method, a sputtering method, an ion assist method, and a plasma CVD method, described below, as well as the plasma CVD method under atmospheric pressure or pressure near atmospheric pressure, also described below.

However, in wet processes such as a spray method or a spin coating method, it is difficult to realize flatness at the molecular level (being the nm level). Further, since solvents are employed, a drawback results in which usable substrates or solvents are limited due to the fact that the substrates, described below, are organic materials. Consequently, in the present invention, those which are formed via the plasma CVD method are preferred. The atmospheric pressure plasma CVD method is particularly preferred since it requires no vacuum chamber and is a high productive casting method capable of achieving high rate casting. By forming the above barrier layer via the atmospheric plasma CVD method, it becomes possible to easily form a uniform film exhibiting surface flatness.

In regard to the plasma CVD method or a plasma CVD method under an atmospheric pressure or pressure near the atmospheric pressure, it is particularly preferred that formation is carried out employing the CVD plasma method under an atmospheric pressure or a pressure near the atmospheric pressure. Layer forming conditions of the plasma CVD method will now be detailed.

A gas barrier layer is preferred which is prepared via the plasma CVD method or the plasma CVD method under an atmospheric pressure or a pressure near the atmospheric pressure for the following reasons. By choosing conditions such as organic metal compounds as a raw material, decomposition gas, decomposition temperature, or applied electric power, it is possible to selectively prepare any of the metal carbides, metal nitrides, metal oxides, metal sulfides, and metal halides, as well as mixtures thereof (such as metal oxide nitrides, metal oxide halides, or metal nitride carbides).

For example, silicon oxide is prepared by employing a silicon compound as a raw material and oxygen as a decomposition gas, while zinc sulfide is prepared by employing a zinc compound as a raw material and carbon disulfide gas as a decomposition gas. The reason for this is as follows. In a plasma space, very active charged particles and active radicals are present at high concentration, whereby multi-staged chemical reaction is accelerated at a high rate and elements existing in the plasma space are converted to thermodynamically stable compounds within a very short period.

Raw materials of the above inorganic compounds may be in any state of gas, liquid, or solid at normal temperature and normal pressure when incorporating transition metal elements. In the case of gas, it may be introduced into a discharge without any modification. In the case of liquid or solid, they are employable upon being vaporized employing means such as heating, bubbling, reduced pressure, or exposure to ultrasonic waves. Further, they may be employed upon being diluted with solvents. Usable solvents include organic solvents such as methanol, ethanol, n-hexane, or mixed solvents thereof. Further, these dilution solvents are subjected to decomposition to molecules or atoms during plasma discharge treatment, whereby their effects are negligible.

Organic metal compounds such as above include silicon compounds such as silane, tetramethoxysilane, tetraethoxysilane, tetra-n-propoxysilane, tetraisoproxysilane, tetra-n-butoxysilane, tetra-t-butoxysilnae, dimethyldimethoxysilane, dimethyldiethoxysilane, dimethyldimethoxysilane, diphenyldimethoxysilane, methyltriethoxysilane, ethyltrimethoxysilane, phenyltriethoxysilane, (3,3,3-trifluoropropyl)trimethoxysilane, hexamethyldisiloxane, bis(dimethylamino)dimethylsilane, bis(dimethylamino)methylvinylsilane, bis(ethylamino)dimethylsilane, N,O-bis(trimethylsilyl)acetamide, bis(trimethylsilyl)carboidiimide, diethylaminotrimethylsilane, dimethylaminodimethylsilane, hexamethyldisilazane, hexamethylcyclotrisilazane, heptamethyldisilazane, nanomethyltrisilazane, octamethylcyclotetrasilazane, tetrakisdimethylaminosilane, tetraisocyanatosilane, tetramethyldisilazane, tris(dimethylamino)silane, triethoxyfluorosilane, allyldimethylsilane, allyltrimethylsilane, benzyltrimethylsilane, bis(trimethylsilyl)acetylene, 1,4-bistrimethylsilyl-1,3-butadine, di-t-butylsilane, 1,3-disilabutane, bis(trimethylsilyl)methane, cyclopentadienyltrimethylsilane, phenyldimethylsilane, phenyltrimethylsilane, propalgyltrimethylsilane, tetramethylsilane, trimethylsilylacetylene, 1-(trimethylsilyl)-1-propine, tris(trimethylsilyl)methane, tris(trimethylsilyl)silane, vinyltrimethylsilane, hexamethyldisilane, octamethylcyclotetrasiloxane, tetramethylcyclotetrasiloxane, hexamethylcyclotetrasiloxane, and M SILICATE 51.

Examples of titanium compounds include titanium methoxide, titanium ethoxide, titanium isoproxide, titanium tetraisoporopoxide, titanium n-butoxide, titanium diisopropoxydo(bis-2,4-pentandionate), titanium diisopropoxydo(bis-2,4-ethylacetate), titanium di-n-butoxyd(bis-2,4-pentanedionate), titanium acetylacetate, and butyl titanate dimers.

Examples of zirconium compounds include zirconium n-propoxide, zirconium n-butoxide, zirconium t-butoxide, zirconium tri-n-butoxydoacetylacetonate, zirconium di-n-butoxydobisacetylacetonate, zirconium acetylacetonate, zirconium acetate, and zirconium hexafluoropentanedionate.

Examples of aluminum compounds include aluminum ethoxide, aluminum triisopropoxide, aluminum isopropoxide, aluminum n-butoxide, aluminum s-butoxide, aluminum t-butoxide, aluminum acetylacetonate, and triethyldialuminum tri-s-butoxide.

Examples of boron compounds include diborane, tetraborane, boron fluoride, boron chloride, boron bromide, borane-diethyl ether complexes, borane-THF complexes, borane-dimethylsulfide complexes, boron trifluoride diethyl ether complexes, triethylborane, trimethoxyborane, triethoxyborane, tri(isopropoxy)borane, borazol, trimethylborazol, triethylborazol, and triisopropylborazol.

Examples of tin compounds include tetraethyltin, tetramethyltin, di-n-butyltin diacetate, tetrabutyltin, tetraoctyltin, tetraethoxytin, methyltriethoxytin, diethyldiethoxytin, triisopropylethoxytin, diethyltin, diisoproipyltin, dibutyltin, diethoxytin, dimethoxytin, diisopropoxytin, dibutoxytin, tin dibutylate, tin diacetacetonate, ethyltin acetacetonate, ethoxytin acetacetonate, dimethyltin diacetacetonate, tin hydride compounds, and tin halides such as tin dichloride or tin tetrachloride.

Further, examples of other organic metal compounds include antimony ethoxide, arsenic triethoxide, barium 2,2,6,6-teramethylheptanedionate, beryllium acetylacetonate, bismuth hexafluoropentanedionate, dimethylcadmium, calcium 2,2,6,6-tetramethylheptanedionate, chromium trifluotopentanedionate, cobalt acetylacetonate, copper hexafluoropentanedionate, magnesium hexafluoropentanedionate-dimethyl ether complexes, gallium ethoxide, tetraethoxygermane, tetramethoxygermane, hafnium t-butoxide, hafnium ethoxide, indium acetylacetonate, indium 2,6-dimethylaminoheptanedionate, ferrocene, lanthanum isoproxide, lead acetate, tetraethyllead, neodymium acetylacetonate, platinum hexafluoropentanedionate, trimethylcyclopentadienylplatinum, rhodium cabonylacetylacetonate, strontium 2,2,6,6-tetramethylheptanedionate, tantalum methoxide, tantalum trifluoroethoxide, tellurium ethoxide, tungsten ethoxide, vanadium triisopropoxydoxide, magnesium hexafluoroacetylacetonate, zinc acetylacetonate, and diethylzinc.

Further, examples of decomposition gases, which decompose raw material gas incorporating those metals to prepare inorganic compounds, include hydrogen gas, methane gas, acetylene gas, carbon monoxide gas, carbon dioxide gas, nitrogen gas, ammonia gas, nitrous oxide gas, nitrogen oxide gas, nitrogen dioxide gas, oxygen gas, water vapor, fluorine gas, fluorine hydride gas, trifluoroalcohol, trifluorotoluene, hydrogen sulfide, sulfur dioxide, carbon disulfide, and chlorine gas.

By choosing appropriately raw material gases incorporating metal elements and decomposition gases, it is possible to prepare various types of metal carbides, metal nitrides, metal oxides, metal halides, and metal sulfides.

Discharge gases, which primarily tend to result in a plasma state, are mixed with the above reactive gases, and the resulting mixture is conveyed into a plasma discharge generator. Employed as such discharge gases are nitrogen gas and/or Group 18 elements in the periodic table, specifically helium, neon, argon, krypton, xenon, and radon. Of these, nitrogen, helium, and argon are preferably employed.

Film formation is carried out by blending the above discharge gases and the reactive gases and feeding the resulting mixed gas into a plasma discharge generator (being a plasma generator). The ratio of discharge gases to the reactive gases may vary depending on the properties of the film to be prepared. However, the reactive gases are supplied so that the ratio of the discharge gases is at least 50% with respect to the entire gas mixture.

FIG. 2 is a schematic view showing one example of an atmospheric pressure plasma discharge treatment apparatus which employs a system in which a substrate is treated between counter electrodes which are useful for the present invention.

The atmospheric pressure plasma discharge treatment apparatus according to the present invention is composed of at least plasma discharge treatment apparatus 30, dual-power source incorporating electric field applying means 40, gas supplying means 50, and electrode temperature controlling means 60.

In FIG. 2, substrate F is subjected to plasma discharge treatment in space (being the discharge space) 32 between counter electrodes composed of roller rotating electrode (first electrode) 35 and a group of square cylindrical type fixed electrodes (second electrodes), resulting in formation of a thin film. In FIG. 2, a pair of a group of square cylindrical electrodes (the second electrode) 36 and roller rotating electrode 35 (the first electrode) form one electric field and the resulting 1 unit form, for example, a low density layer. FIG. 2 shows an example of the constitution in which the unit constituted as above is arranged at 5 positions. By independently controlling the type of raw materials and output voltage supplied by each of the units, it is possible to continuously form a transparent gas barrier layer of the laminated layer type specified in the present invention.

The following high frequency electric fields are applied to discharge space 32 (the space between counter electrodes) between rotating roller electrode 35 (the first electrode) and square cylindrical type fixed electrode group 36 (the second electrodes). A first high frequency electric field of frequency $\omega_1$, electric field strength $V_1$ and electric current $I_1$ is applied to rotating roller electrode (the first electrode) 35 from first power source 41, while second high frequency electric field of frequency $\omega_2$, electric field strength $V_2$ and electric current $I_2$ is applied to each of square cylindrical type electrodes group 36 from each of the corresponding second power source 42.

First filter 43 is arranged between rotating roller electrode 35 (the first electrode) and first power source 41. First filter 43 is designed so that electric current from first power source 41 to the first electrode readily flows and electric current from second power source 42 to the first power source barely flows while the electric current from second power source 42 is grounded. Further, second filter 44 is arranged respectively between square cylindrical type electrode group 36 (the second electrodes). Second filter 43 is designed so that electric current from second power source 42 to the second electrode readily flows and electric current from first power source 41 to the second power source barely flows while the electric current from first power source 42 is grounded.

Further, in the present invention, rotating roller electrode 35 may be employed as the second electrode, and square cylindrical fixed electrode group 36 may be employed as the first electrode. In either case, the first power source is connected to the first electrode, while the second power source is connected to the second electrode. It is preferable that the first electrode results in application of a higher high frequency electric field intensity than the second power source (namely $V_1 > V_2$). Further, the possibility exists to result in $\omega_1 < \omega_2$.

Further, it is preferable that electric current results in $I_1 < I_2$. Electric current $I_1$ of the first high frequency electric field is preferably 0.3-20 mA/cm$^2$, but is more preferably 1.0-20 mA/cm$^2$, while electric current $I_2$ of the second high frequency electric field is preferably 10-100 mA/cm$^2$, but is more preferably 20-100 mA/cm$^2$.

Gas G generated by gas generator 51 of gas supply means 50 is subjected to flow rate control and is introduced into plasma discharge treatment vessel 31 from a gas supply inlet.

Substrate F is conveyed from a master roll (not shown) while being unwound or conveyed from the previous process. It passes over guide roller 64 and is subjected to insulation of accompanied air by nip roller 65. Subsequently, while brought into contact with roller rotating electrode 35 and being run around, it is conveyed between rotating roller electrode 35 and square cylindrical fixed electrode group 36 and is subjected to application of the electric field from both rotating roller electrode 35 (the first electrode) and square cylindrical fixed electrode group 36 (the second electrodes), whereby discharge plasma is generated between facing electrodes 32 (in the discharge space). Substrate F is run around while brought in contact with rotating roller electrode 35 and results in formation of a thin film due to plasma state gas. Resulting substrate F is wound up after passing nip roller 66 and guide roller 67, employing a winder (not shown), or conveyed to the next process.

Treatment exhaust gas G' which has subjected to discharge treatment is discharged from exhaust 53.

During formation of the above thin film, in order to heat or cool rotating roller electrode 35 (the first electrode) and square cylindrical fixed electrode group 36 (the second electrodes), the medium, which has been subjected to temperature control via electrode temperature control means 60, is conveyed to both types of electrodes via piping 61 employing liquid conveying pump P, whereby temperature is controlled via the interior of the electrodes. Incidentally, 68 and 69 are partitions which isolate plasma treatment vessel 31 from the exterior.

In the gas barrier layer according to the present invention, inorganic compounds incorporated in the gas barrier layer are preferably $SiO_x$, $SiN_x$, or $SiO_xN_y$ (where x is 1-2, while y is 0.1-1). In view of water permeability, light transmittance, and the atmospheric pressure plasma CVD adaptability, described below, they are preferably $SiO_x$.

It is possible to combine, at a predetermined ratio, inorganic compounds according to the present invention with the above organic silicon compounds and further oxygen gas and nitrogen gas, and to prepare a film incorporating at least an O atom or an N atom, and a Si atom. Further, $SiO_2$ exhibits relatively high transparency but relatively low gas barrier properties due to permeation of some moisture, whereby incorporation of N atoms is more preferred. Namely, when the ratio of the number of oxygen atoms to the number of nitrogen atoms is expressed by x:y, x/(x+y), the ratio is preferably at most 0.95, but is more preferably at most 0.80. Accordingly, in the gas barrier layer according to the present invention, light transmittance T is preferably at least 80%.

Further, when the ratio of N atoms increases, the resulting light transmittance decreases, whereby when x=0, the resulting color tends to become yellowish. Consequently, the specific ratio of oxygen atoms to nitrogen atoms may be determined depending on its use. For example, in a display device, in the use which requires higher light transmittance when a film is formed on the light emitting side of a light emitting element, it is preferable that x/(x+y) is 0.4-0.95, since it is thereby possible to realize compatibility of light transmittance and water resistance. Further, in the use in which light is preferably absorbed or shielded as for imaging inhibiting film arranged on the reverse side of the light emitting element of the display device, it is preferable that x/(x+y) is 0-0.4.

Consequently, the gas barrier layer of the present invention is preferably, transparent. By making the above gas barrier layer transparent, it is possible to make the gas barrier film transparent, whereby it become to possible to apply organic EL elements to transparent substrates.

FIG. 1 is a schematic view showing one example of the layer configuration of the transparent gas barrier film according to the present invention, and the density profile thereof.

Transparent gas barrier film 1 according to the present invention incorporates substrate 2, having thereon laminated layers which differ in density. In the present invention, a feature is that medium density layer 4 according to the present invention is arranged between low density layer 3 and high density layer 5. Further, medium density layer 4 is arranged on the high density layer, and configuration composed of these low density layer, medium density layer, high density layer, and medium density layer is designated as one unit. FIG. 1 shows an example in which two such units are laminated. At the time, the density distribution in each of the density layers is controlled to be uniform and density change between adjacent layers becomes step-like. Further, in FIG. 1, medium density layer 4 is shown as a single layer but if necessary, may be composed of two layers.

<<Substrates>>

Substrates employed for the transparent gas barrier film according to the present invention are not particularly limited as long as they are composed of organic materials capable of maintaining a gas barrier layer exhibiting the above barrier properties.

Specifically employed may be polyolefin (PO) resins such as a homopolymer of ethylene, polypropylene, butane or a copolymer; amorphous polyolefin resins (APO), polyester based resins such as polyethylene terephthalate (PET), or polyethylene 2,6-naphthalate (PEN), polyamide based (PA) resins such as nylon 6, nylon 12, or copolymer nylon, polyvinyl alcohol based resins such as polyvinyl alcohol (PVA) resins or ethylene-vinyl alcohol copolymers (EVOH), polyimide resins (PI), polyetherimide (PEI) resins, polysulfone (PS) resins, polyethersulfone (PES) resins, polyether ketone (PEEK) resins, polycarbonate (PC) resins, polyvinyl butyral (PVB) resins, polyarylate (PAR) resins, as well as fluorine based resins such as ethylene-ethylene tetrafluoride copolymer (ETFE), ethylene trifluoride monochloride (PFA), ethylene tetrafluoride-perfluoroalkyl vinyl ether copolymer (FEP), vinylidene fluoride (PVDF), vinyl fluoride (PVF), or perfluorovinyl ether copolymer (EPA).

Further, other than the resins listed above, employed may be photocurable resins such as resin compositions composed of acrylate compounds incorporating radically reactive unsaturated compounds, resin compositions composed of the above acrylate compounds and mercapto compounds having a thiol group, and resin compositions prepared by dissolving, in polyfunctional acrylate monomer, oligomers such as epoxyacrylate, urethane acrylate, polyester acrylate or polyether acrylate, and mixtures thereof. Further, it is possible to employ, as a substrate film, those which are prepared by laminating at least one of the above resins by means of lamination or coating.

These materials may be employed individually or appropriately blended. Of these, preferably employed are commercially available products such as ZEONEX and ZEONOA (produced by Nippon Zeon Co., Ltd.), amorphous cyclopolyolefin resin film, ARTON (produced by JSR, Inc.), polycarbonate film, PUREACE (produced by TEIJIN Ltd.), cellulose acetate film, KONICA MINOLTA TAC KC4UX and KC8UX (produced by Konica Minolta Opto, Inc.).

Further, the substrate is preferably transparent. When a substrate and the layers formed on the substrate are transparent, it is possible to make the resulting gas barrier film transparent, whereby it is possible to employ it as a transparent substrate of organic EL elements.

Still further, the substrate according to the present invention the employing resins listed above may be an unstretched film or a stretched film.

It is possible to produce the substrate according to the present invention employing common methods known in the art. For example, material resins are fused employing an extruder, extruded via a ring-like die or a T-die, and rapidly cooled, whereby it is possible to produce a substrate which is substantially amorphous, is not oriented and not stretched. Further, it is possible to produce a stretched substrate in such a manner that an unstretched substrate is stretched in the substrate traveling (longitudinal) direction or at a right angle (perpendicular) to the substrate conveying direction, employing methods known in the art, such as uniaxial stretching, tenter system sequential biaxial stretching, or tubular system simultaneous biaxial stretching. In such stretching, the stretching factor may be appropriately selected matched to the resins as a substrate material, but is preferably 2-10 times in the longitudinal direction and the lateral direction.

Further, prior to forming a deposition film, the substrate according to the present invention may be subjected to surface treatment such as a corona treatment, a flame treatment, a plasma treatment, a glow-discharge treatment, a surface-roughening treatment, or a chemical treatment.

Still further, to enhance adhesion to the deposition film, an anchor coating layer may be formed on the surface of the substrate according to the present invention. Anchor coating materials employed in the above anchor coating layer may include polyester resins, isocyanate resins, urethane resins, acrylic resins, ethylene vinyl alcohol resins, modified vinyl resins, epoxy resins, modified styrene resins, modified silicone resins, and alkyl titanate. These may be employed individually or in combinations of at least two types. Additives known in the art may be added to the above anchor coating agents. Further, the above anchor coating materials may be applied onto a substrate, employing methods known in the art, such as roller coating, gravure coating, knife coating, dip coating, or spray coating. Subsequently, solvents and thinners are removed via drying, whereby it is possible to form an anchor coating layer. The coated weight of the above anchor coating agents is preferably about 0.1—about 5 g/m$^2$ (in the dry state).

As a substrate, a long-length product, which is wound into a roll, is convenient. Further, the thickness of the film-like substrate employed in the present invention is preferably 10-200 μm, but is more preferably 50-100 μm.

Since organic EL displays and highly detailed color liquid crystal displays require high water vapor barring properties, water vapor permeability, determined by the JIS K 7129 method, is preferably at most 1.0 g/m$^2$/day. Further, when the organic EL display according to the present invention is applied to a display, water vapor permeability is preferably less than 0.1 g/m$^2$/day, since the display life is sometimes extremely shortened by formation of dark spots due to the presence of a minute amount of water vapor.

EXAMPLES

The present invention will now be described with reference to examples, however the present invention is not limited thereto.

Example 1

Preparation of Organic EL Element (Preparation of Organic EL Element OLED1-1)

A transparent gas barrier film was prepared in such a manner that three units, each of which is composed of a low density layer, a medium density layer, a high density layer, and another medium density layer in that order are applied, onto a 100 μm thick polyethylene terephthalate film (produced by Teijin DuPont Ltd., and hereinafter referred to as PEN) under the following discharge conditions employing the following atmospheric pressure plasma discharge treatment apparatus to result in the density distribution profile shown in FIG. 1.

(Atmospheric Plasma Discharge Treatment Apparatus)

By employing the atmospheric plasma discharge treatment apparatus described in FIG. 2, a roller electrode covered with dielectric compounds and a set of plurality of square cylindrical electrodes were prepared as follows.

The roller electrode employed as the first electrode was prepared as follows. Titanium alloy T64 jacket roller metallic base material, having a cooling means employing cooling water, was covered with a high density and high adhesive alumina sprayed film to realize a roller diameter of 1,000 mm. On the other hand, the square cylindrical electrode of the second electrode was prepared as follows. A hollow square cylindrical titanium alloy T64 was covered with the same dielectrics as above at a thickness of 1 mm under identical conditions, whereby a counter square cylindrical fixed electrode group was prepared.

Regarding the rotating roller electrode, 24 of above square cylindrical electrodes were arranged while 1 mm gap between the counter electrodes was maintained. The total discharge area of the square cylindrical electrode group was 150 cm (length in the lateral direction)×4 cm (length in the conveying direction)×24 (the number of electrodes) to equal 14,400 cm$^2$. Meanwhile, appropriate filters were arranged in each case.

During plasma discharge, the first electrode (the rotating roller electrode) and the second electrode (the square cylindrical fixed electrode group) were subjected to temperature control at 80° C. and the rotating roller electrode was driven to rotate, whereby a thin film was formed. Of the above 24 square cylindrical electrodes, from the upstream side, 4 electrodes were employed to form the first layer (Low Density Layer 1) described below, the subsequent 6 electrodes were employed to form the 2nd layer (Medium Density Layer 1) described below, the following 8 electrodes were employed to form the 3rd layer (High Density Layer 1), and the remaining 6 electrodes were employed to form the 4th layer (Medium Density Layer 1). Four layers were laminated in one pass, while setting each respective condition. Subsequently, the above conditions were repeated twice, whereby Transparent Gas Barrier Film 1 was prepared.

(Discharge Conditions)

(1st Layer: Low Density Layer 1)

Plasma discharge was carried out under the following conditions, whereby about 90 nm thick Low Density Layer 1 was formed.

<Gas Conditions>

| | |
|---|---|
| Discharge gas: nitrogen gas | 94.8% by volume |
| Thin layer forming gas: hexamethyldisiloxane | 0.2% by volume |
| (vaporized via a vaporizer produced by | |
| Lintec Co., while blended with nitrogen gas) | |
| Additive gas: oxygen gas | 5.0% by volume |

<Power Source Conditions: Only Employed for the Power Source on the First Electrode Side>

First electrode side: power source type, high frequency power source produced by Oyo Electric Co., Ltd.

| | |
|---|---|
| Frequency | 80 kHz |
| Output density | 10 W/cm$^2$ |

Density of the 1st layer (low density layer), prepared as above, was determined via an X-ray reflectance method employing MXP21 produced by MAC Science Co., Ltd., resulting in 1.90.

(2nd Layer: Medium Density Layer 1)

Plasma discharge was carried out under the following conditions, whereby about 90 nm thick Medium Density Layer 1 was formed.

<Gas Conditions>

| | |
|---|---|
| Discharge gas: nitrogen gas | 94.9% by volume |
| Thin layer forming gas: hexamethyldisiloxane | 0.1% by volume |
| (vaporized via the vaporizer produced by | |
| Lintec Co., while blended with nitrogen gas) | |
| Additive gas: oxygen gas | 5.0% by volume |

<Power Source Conditions: Employed Only in the Power Source on the First Electrode Side>

First electrode side, power source type, high frequency power source produced by Oyo Electric Co., Ltd.

| | |
|---|---|
| Frequency | 80 kHz |
| Output density | 10 W/cm$^2$ |

Density of the 2nd layer (low density layer), prepared as above, was determined via an X-ray reflectance method employing MXP21 produced by MAC Science Co., Ltd., resulting in 2.05.

(3rd Layer: High Density Layer 1)

Plasma discharge was carried out under the following conditions, whereby about 90 nm thick High Density Layer 1 was formed.

<Gas Conditions>

| | |
|---|---|
| Discharge gas: nitrogen gas | 94.9% by volume |
| Thin layer forming gas: hexamethyldisiloxane | 0.1% by volume |
| (vaporized via the vaporizer produced by | |
| Lintec Co., while blended with nitrogen gas) | |
| Additive gas: oxygen gas | 5.0% by volume |

<Power Source Conditions>

1st electrode side, power source Type, high frequency power source produced by Oyo Electric Co., Ltd.

| | |
|---|---|
| Frequency | 80 kHz |
| Output density | 10 W/cm$^2$ |

2nd electrode side, power source type: high frequency power source produced by Pearl Kogyo Co., Ltd.

| | |
|---|---|
| Frequency | 13.56 kHz |
| Output density | 10 W/cm$^2$ |

Density of the 3rd layer (high density layer), prepared as above, was determined via an X-ray reflectance method employing MXP21 produced by MAC Science Co., Ltd., resulting in 2.20.

(4th Layer: Medium Density Layer 2)

Medium Density Layer 2 was prepared under the same conditions as in above 2nd layer (Medium Density Layer 1).

Water vapor transmission rate was determined employing the method based on JIS K 7129B, resulting in at most $1.0 \times 10^{-3}$ g/m$^2$, while the oxygen transmission rate was determined employing the method based on JIS K 7126B, resulting in at most $1 \times 10^{-3}$ g/m$^2$/g.

(Preparation of ITO Substrate)

Subsequently, 120 nm thick ITO (indium tin oxide) film was formed on the above gas barrier film substrate, followed by patterning. Thereafter, the resulting substrate provided with the above ITO transparent electrode was subjected to ultrasonic cleaning via isopropyl alcohol, was dried via desiccated nitrogen gas, and was subjected to UV ozone cleaning for 5 minutes. The resulting substrate was fixed to the substrate holder of a commercially available vacuum evaporation apparatus followed by reduction of pressure to a vacuum degree of $4\times10^{-4}$ Pa, whereby ITO Substrate 100 was prepared.

(Formation of Positive Hole Transporting Layer)

Subsequently, as shown in FIG. 3, while ink-jet recording head 10 is moving at a high rate with respect to ITP substrate 100, droplets D, incorporating Exemplified Compound B6, were deposited via discharging fluid D incorporating Exemplified Compound B6 as a positive hole transporting material onto the upper surface of substrate 100. The deposited droplets (fluid D) exhibited a diameter of about several tens μm, and positive hole transporting layer 111 was formed via discharge of a predetermined amount of fluid D. Subsequently, polymerization was performed under heating conditions at 200° C. for one hour, whereby a thin polymer film was formed. The average molecular weight of the resulting polymer was approximately 10,000 (at a repeating unit of 16.6) and the film thickness was 50 nm.

(Formation of Electron Transporting Layer)

In the same manner as in the formation of the above positive hole transporting layer, fluid D incorporating Exemplified Compound B7 as a electron transporting material was discharged onto substrate 100 having positive hole transporting layer 111 from ink-jet recording head 10, whereby droplets incorporating Exemplified Compound B7 were deposited. The deposited droplets exhibited a diameter of about several tens μm, and electron transporting layer 112 was formed via discharge of a predetermined amount of fluid. Further, polymerization was performed under heating conditions at 200° C. for one hour, whereby a thin polymer film was formed. The average molecular weight of the resulting polymer was approximately 20,000 (at a repeating unit of 40.5) and the film thickness was 50 nm.

(Formation of Cathode)

A 200 nm thick layer of aluminum was deposited onto electron transporting Layer 112, prepared as above, whereby cathode 113 was formed.

(Sealing Via Gas Barrier Film)

Sealing via gas barrier film 114 was carried out in such a manner that the side forming a gas barrier film was sealed while being opposed with a cathode, whereby Organic Element OLED 1-1 of the present invention was formed. When 20 V voltage was applied to resulting Organic Element OLED 1-1, employing the ITO side as positive and the aluminum side as negative, green light emission at a peak wavelength of 500 nm was observed.

(Preparation of Organic Element OLED2-1)

Organic EL Element 2-1 was prepared in the same manner as above Organic EL Element 1-1, except that the constitution of the positive hole transporting layer and the electron transporting layer was changed as follows.

(Formation of Positive Hole Transporting Layer)

Fluid D, incorporating Exemplified Compound A7 as a positive hole transporting material and dodecylmercaptan (at a mol ratio of 10:1), was discharged onto the upper surface of substrate 100, whereby positive hole transporting layer 111 was formed. Subsequently, polymerization was performed under heating conditions at 200° C. for one hour, whereby a thin polymer film was formed. The average molecular weight of the resulting polymer was approximately 50,000 (at a repeating unit of 9.2) and the film thickness was 50 nm.

(Formation of Electron Transporting Layer)

Fluid D, incorporating Exemplified Compound A12 as an electron transporting material and octadecyl alcohol (at a mol ratio of 10:1), was discharged onto the upper surface of substrate 100, whereby electron transporting layer 112 was formed. Subsequently, polymerization was performed under heating conditions at 200° C. for one hour, whereby a thin polymer film was formed. The average molecular weight of the resulting polymer was approximately 4,000 (at a repeating unit of 8.0) and the film thickness was 50 nm.

(Preparation of Organic EL Element OLED3-1)

Organic EL Element OLED3-1 of the present invention was prepared in the same manner as above Organic EL Element OLED1-1, except that constitutions of the positive hole transporting layer and the electron transporting layer were changed as follows.

By employing the same method as above, α-NPD was applied onto the ITO substrate at a 50 nm film thickness to form a positive hole transporting layer. After drying the resulting coating at 100° C. for 30 minutes, Alq$_3$ as an electron transporting material was applied at a thickness of 50 nm, and the resulting coating was dried in the same manner as above. Subsequently, 0.5 nm thick LiF and 110 nm thick Al each were deposited to form a cathode, whereby Comparative Organic EL Element OLED3-1 was prepared.

(Preparation of Organic El Element 4-1)

Organic El Element 4-1 of the present invention was prepared in the same manner as above Organic EL element OLED1-1, except that the constitutions of the positive hole transporting layer and the electron transporting layer were changed as follows.

Positive hole transporting layer 111 was formed by discharging, onto substrate 100, fluid D incorporating Exemplified Compound B6 as a positive hole transporting material. Subsequently, polymerization was carried out under conditions of an exposure electron current of 5 mA and electron exposure energy of −50 eV, whereby a thin polymer film was formed. The average molecular weight of the formed polymer was approximately 18,000 (at a repeating unit of 30.0) and the film thickness was 50 nm.

Fluid D, incorporating Exemplified Compound D8 as a electron transporting material, was discharged in the same manner as above onto the upper surface of substrate 100, whereby electron transporting layer 112 was formed. The average molecular weight of the formed polymer was approximately 15,000 (at a repeating unit of 28.3) and the film thickness was 50 nm. Further, after sealing, the degree of polymerization was enhanced by applying, to the above element, electric current of a current density of 50 mA/cm$^2$.

<<Evaluation of Organic EL Elements>>

Each of the organic EL elements, prepared as above, was evaluated for each characteristic employing the following methods. Table 1 shows the results.

(Evaluation of Light Emission Luminance)

Organic EL Element OLED3-1 resulted in a flow of electric current at an initial driving voltage of 4 V, whereby it resulted in green light emission. With regard to Organic EL Elements OLED1-1 and OLED2-1, light emission luminance (cd/m$^2$) and light emission efficiency (in lm/W) were determined when 10 V direct current voltage was applied at 23° C. The above light emission luminance and the light emission efficiency each were expressed as a relative value when each value of Organic EL Element OLED3-1 was 100. The light emission luminance was determined employing a spectroradioluminance meter CS-1000 (produced by Konica Minolta Sensing, Inc.).

(Evaluation of Durability)

During driving each organic EL element employing a constant electric current of 10 mA/cm$^2$, a half-life period, which passed until the initial luminance decreased to one half, was determined and the resulting value was employed as an index of durability. The half-life period was expressed as a relative value when the value of Organic EL Element OLED 3-1 was 100.

Further, after 20-hour drive at a constant electric current of 10 mA/cm$^2$, the number of visually noticeable non-light emitting points (dark spots) was determined in an area of 2 mm×2 mm.

TABLE 1

| Organic EL Element | Light Emission Luminance | Half-Life Period | Number of Dark Spots | Remarks |
|---|---|---|---|---|
| OLED1-1 | 110 | 140 | 7 | Present Invention |
| OLED2-1 | 106 | 135 | 9 | Present Invention |
| OLED3-1 | 100 | 100 | 60 | Comparative Example |
| OLED4-1 | 109 | 138 | 8 | Present Invention |

As can clearly be seen from Table 1, the organic EL elements, constituted as specified by the present invention, resulted in a marked decrease in dark spots and enhancement in half-life period. Further, enhancement in luminance was noted.

Example 2

Preparation of Organic EL Elements

Under the same conditions as those which were employed to prepare Organic EL Element OLED1-1 described in Example 1, Organic EL Elements OLED5-1-3 were prepared, which were composed of materials and resulted in the film thickness described in Table 2 below. Further, under the same conditions as those which were employed to prepare Organic EL Element OLED2-1, Organic EL Elements OLED5-4-6, were prepared which were composed of materials and resulted in the film thickness, described in Table 2 below. Still further, under the same conditions as those which were employed to prepare Organic EL Element OLED3-1, Comparative Organic EL element OLED5-7 was prepared, which was composed of materials and resulted in the film thickness, described in Table 2 below.

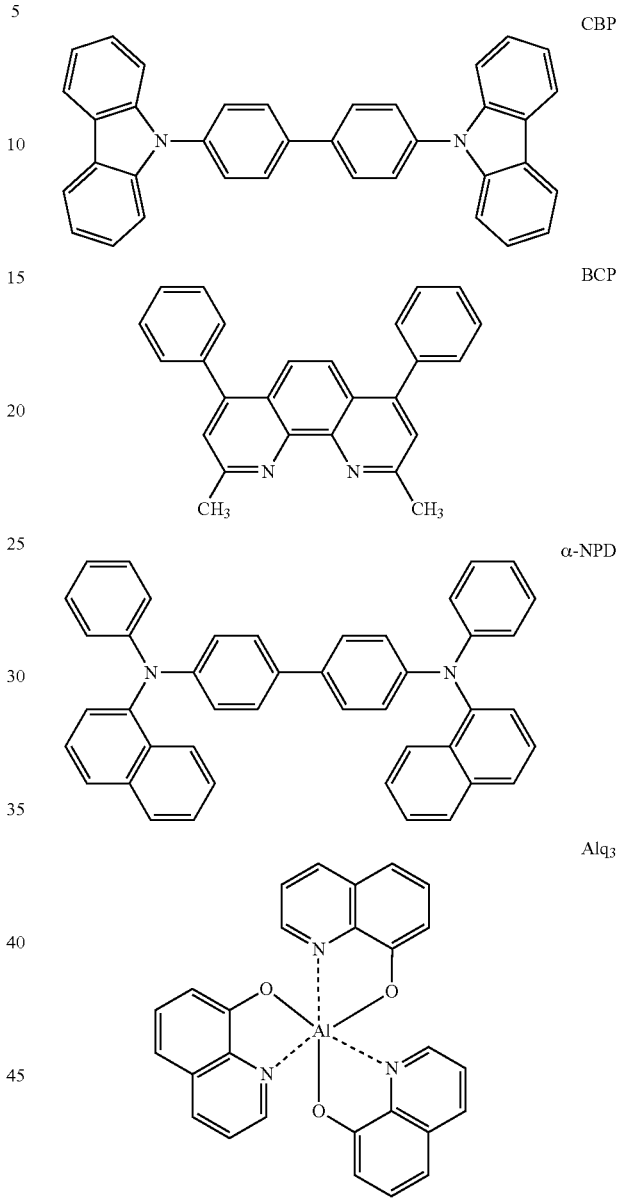

TABLE 2

| Organic EL Element | Positive Hole Transporting Layer (50 nm) | | Light Emitting Layer (50 nm) | | | Electron Transporting Layer (50 nm) | | Cathode (100 nm) | |
|---|---|---|---|---|---|---|---|---|---|
| | Constituent | Repeating Unit | Host Material | Dopant (5 mol %) | Repeating Unit | Constituent | Repeating Unit | Constituent | Remarks |
| OLED5-1 | B16 | 45.0 | B13 | Ir-12 | 35.0 | BCP | — | Al | Inv. |
| OLED5-2 | B16 | 55.5 | B17 | D-1 | 34.5 | B30 | 43.2 | Al | Inv. |
| OLED5-3 | B16 | 77.5 | B17 | Ir-12 | 62.2 | B28 | 60.5 | Al | Inv. |
| OLED5-4 | A7 + C$_8$H$_{17}$SH | 8.5 | A15 | Ir-12 + C$_8$H$_{17}$SH | 8.0 | BCP | — | Al | Inv. |
| OLED5-5 | A7 + C$_{12}$H$_{25}$OH | 7.8 | A13 | D-1 + C$_{12}$H$_{25}$OH | 7.7 | A12 | 8.0 | Al | Inv. |

TABLE 2-continued

| Organic EL Element | Positive Hole Transporting Layer (50 nm) Constituent | Repeating Unit | Light Emitting Layer (50 nm) | | Repeating Unit | Electron Transporting Layer (50 nm) Constituent | Repeating Unit | Cathode (100 nm) Constituent | Remarks |
| --- | --- | --- | --- | --- | --- | --- | --- | --- | --- |
| | | | Host Material | Dopant (5 mol %) | | | | | |
| OLED5-6 | A16 + $C_{14}H_{29}Br$ | 9.5 | A14 | D-1 + $C_{14}H_{29}Br$ | 9.0 | A18 | 9.0 | Al | Inv. |
| OLED5-7 | α-NPD | — | CBP | Ir-12 | — | BCP | — | Al | Comp. |

Inv.: Present Invention,
Comp.: Comparative Example

<<Evaluation of Organic EL Elements>>

Organic EL Elements OLED5-1-7 were evaluated for each characteristic employing the same methods described in Example 1. Table 3 shows the results.

TABLE 3

| Organic EL Element | Light Emission Luminance | Half-Life Period | Number of Dark Spots | Remarks |
| --- | --- | --- | --- | --- |
| OLED5-1 | 107 | 120 | 10 | Present Invention |
| OLED5-2 | 112 | 135 | 6 | Present Invention |
| OLED5-3 | 113 | 140 | 7 | Present Invention |
| OLED5-4 | 104 | 118 | 14 | Present Invention |
| OLED5-5 | 108 | 128 | 13 | Present Invention |
| OLED5-6 | 109 | 130 | 11 | Present Invention |
| OLED5-7 | 100 | 100 | 75 | Comparative Example |

As can clearly be seen from the results of Table 3, of phosphorescence emitting type organic EL elements, the organic EL elements composed as specified by the present invention resulted in higher light emission luminance, exhibited longer life, minimized formation of dark spots, and exhibited higher durability, compared to the Comparative Example.

Further, Organic EL Element OLED5-3, in which a compound having a polymerizable group and another compound having a reactive group were employed in combination, exhibited higher durability than Organic EL Element OLED5-1 in which the compound having a reactive group was employed as an electron transporting material and resulted in the same durability enhancing effects as Organic EL Element OLED5-2. Consequently, it is preferable that in at least some portion near the interface of the light emitting layer and the electron transporting layer, a covalent bond is formed.

Example 3

Figure 5:
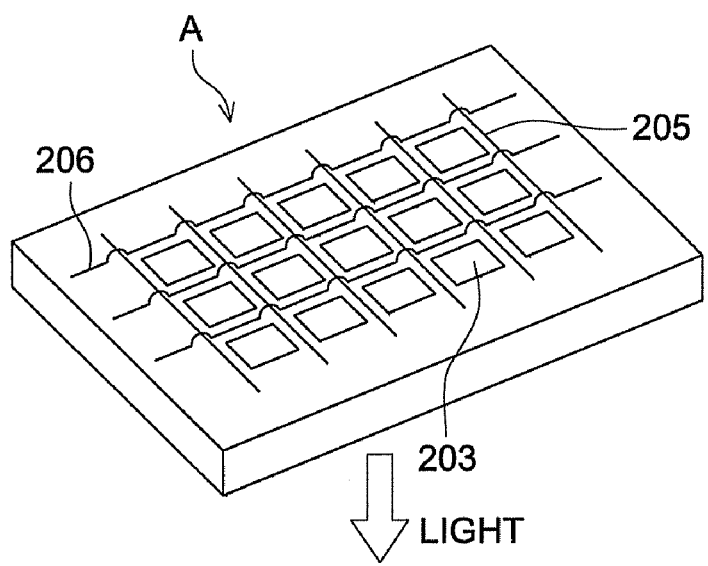
FIG. 5 is a schematic view of Display Section A.

Organic EL Element 5-2 prepared in Example 2, a green light emitting organic EL element which was prepared in the same manner as Organic EL Element OLED5-2 of the present invention prepared in Example 2, except that the phosphorescent compound was replaced with Exemplified Compound Ir-1, and a red light emitting organic El element which was prepared in the same manner as Organic EL Element OLED5-2 of the present invention, except that the phosphorescent compound was replaced with Exemplified Compound Ir-9, were arranged on the same substrate, whereby the active matrix system full-color display device was prepared. In FIG. 5, only shown is the schematic view of display section A of the prepared full-color display device. Namely, on the same substrate, provided are a wiring section incorporating a plurality of scanning lines 205 and data lines 206, and a plurality of pixels 203 (such as pixels which emit light in the red, green or blue region). Scanning lines 205 and a plurality of data lines 206 are each composed of conductive materials. Scanning lines 205 and data lines 206 intersect lattice-like at right angles to one another and connect to pixel 203 at each intersection at right angles (details of which are not shown in the figure). The above plurality of pixels 3 is driven via the active matrix system provided with organic El elements corresponding to each of the emitted light colors and each of the switching transistors and driving transistors as an active element. When scanning signals are applied from scanning lines 205, image data signals are received from data lines 206 and light is emitted depending on the received image data. By appropriately arranging each of the red, green and blue pixels as described above, it is possible to achieve a full-color display. Further, by driving the full-color display device, bright and clear full-color moving images are produced.

Example 4

Preparation of Lighting Device

Figure 6:
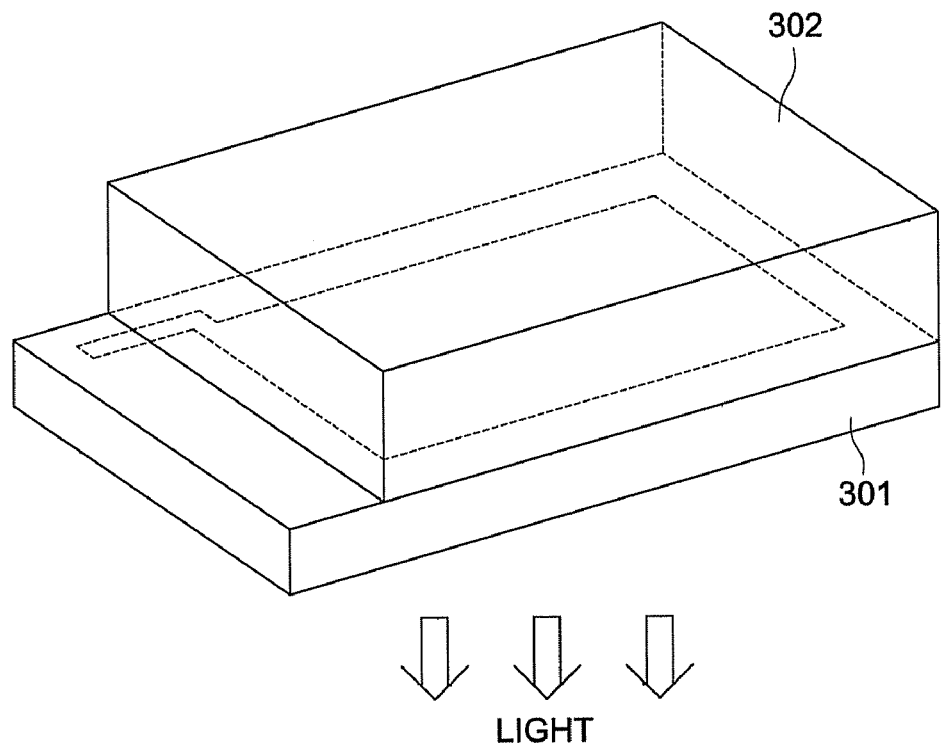
FIG. 6 is a schematic view of a lighting device.
Figure 7:
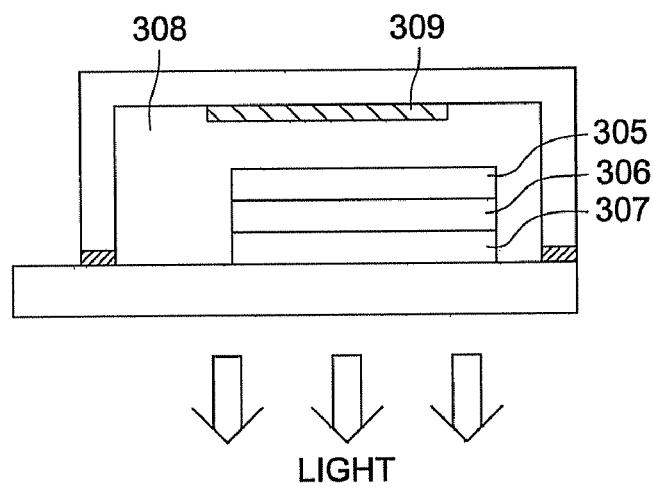
FIG. 7 is a sectional view of a lighting device.

The non-light emitting surface of each of the organic EL elements, which emit individually blue light, green light, or red light, prepared in Example 3, was covered with a glass case, whereby a lighting device was prepared. It is possible to employ the resulting lighting device as a thin white light emitting lighting device which resulted in high light emission efficiency and long life. FIG. 6 is a schematic view of the lighting device, while FIG. 7 is a sectional view of the lighting device. Organic EL Element 301 was covered with glass cover 302. Numeral 305 is a cathode, 306 is an organic EL layer, and 307 is a glass substrate provided with a transparent electrode. Further, the interior of glass cover 302 is filled with nitrogen gas 308, and water catching agent 309 is provided.

Subsequently, color reproduction range during combination with commercially available filters for display was evaluated. In combination of organic EL elements with color filters, it was confirmed that the color reproduction range was broad and excellent performance was realized in color reproduction.

The invention claimed is:

1. An organic electroluminescence element comprising a substrate having thereon an anode, a cathode and a plurality of organic layers between the anode and the cathode,
   wherein at least one of the organic layers is a first organic layer comprising a first oligomer compound having 2 to 10 repeating units; and
   the organic electroluminescence element further comprises a second organic layer comprising a second oligomer compound stacked on the first organic layer, provided that the second oligomer compound has 2 to 10 repeating units; and the first organic layer is an electron transporting layer and the second organic layer is a positive hole transporting layer.

2. The organic electroluminescence element of claim 1, wherein the substrate is a transparent gas barrier film.

3. The organic electroluminescence element of claim 1, wherein the organic electroluminescence element emits a white light.

4. A display device comprising the organic electroluminescence element of claim 3.

5. A lighting device comprising the electroluminescence element of claim 3.

6. A display device comprising:
    a liquid crystal element as a display means; and
    the lighting device of claim 5.

7. The organic electroluminescent element of claim 1, wherein the repeating unit in the first oligomer compound and the second oligomer compound is derived from at least one selected from the groups consisting of:

A1
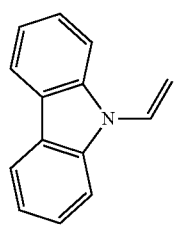

A2
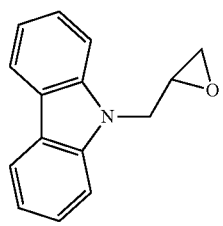

A3
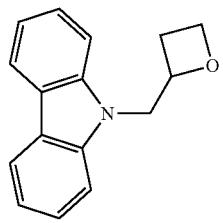

A4
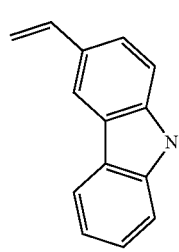

-continued

A5
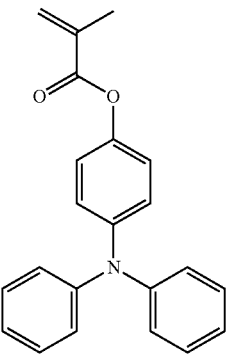

A6
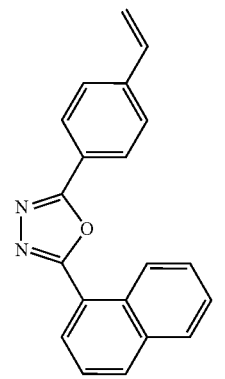

A7
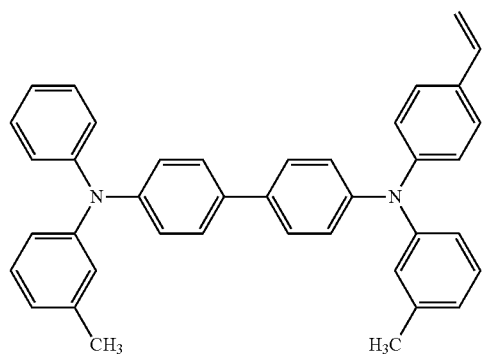

A8
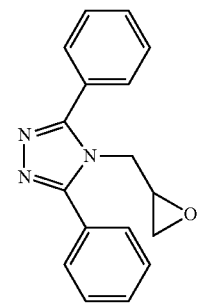

A9
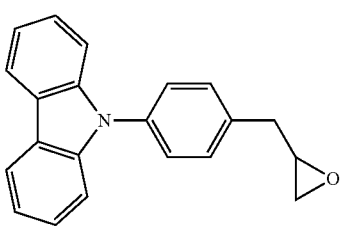

-continued
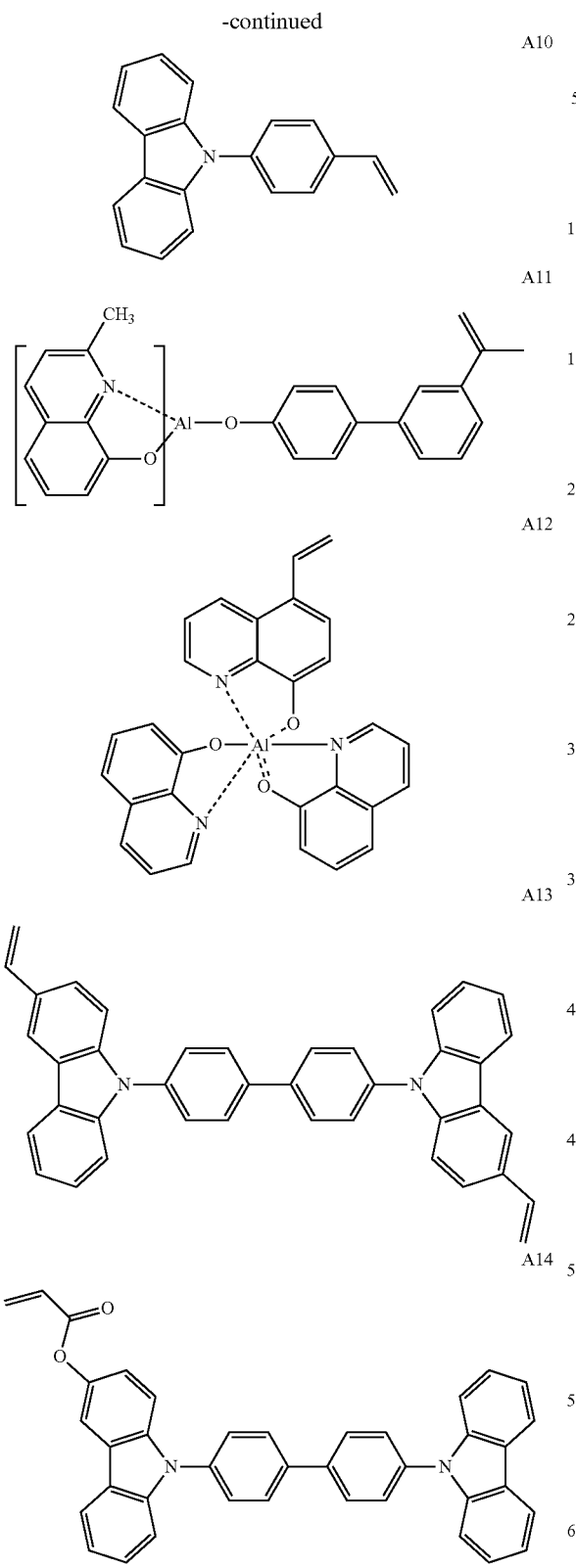
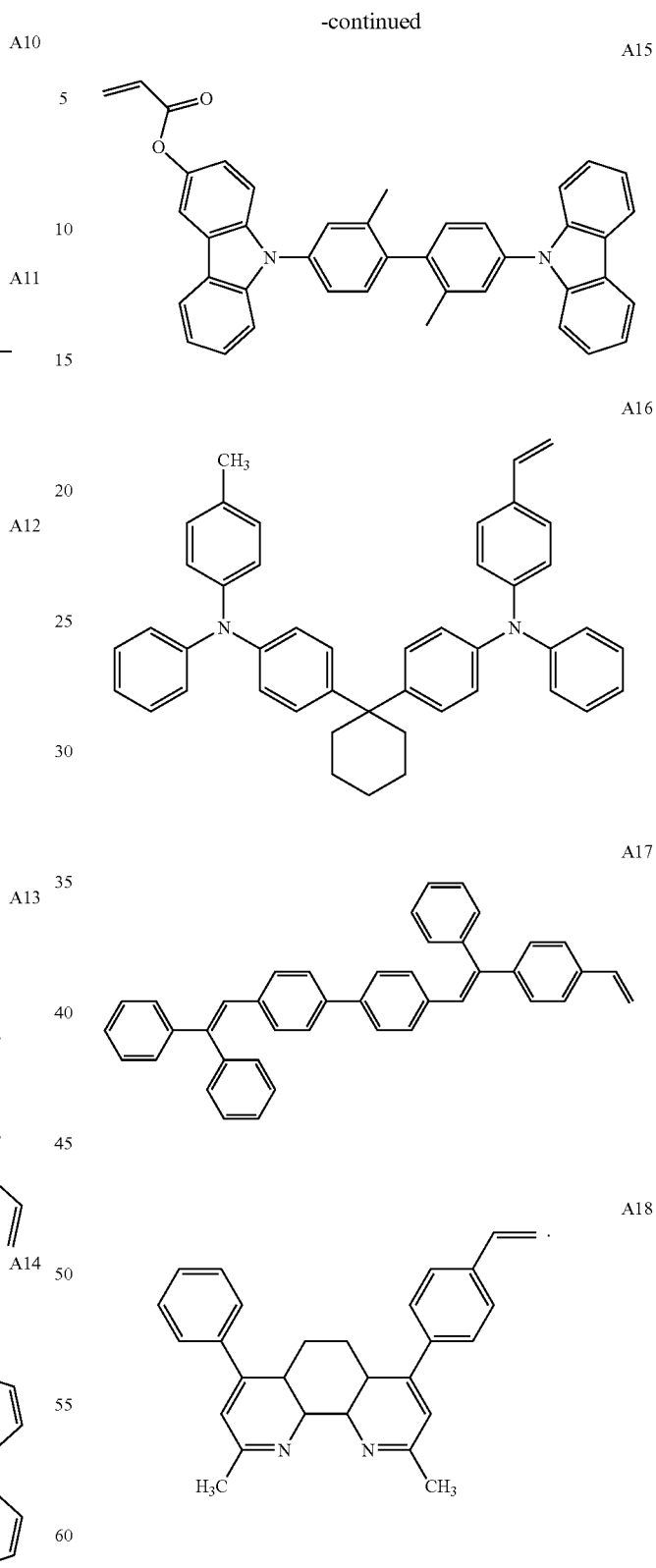
* * * * *